US012100473B2

(12) United States Patent
Kolar et al.

(10) Patent No.: US 12,100,473 B2
(45) Date of Patent: Sep. 24, 2024

(54) COMPUTER MEMORY ARRAYS EMPLOYING MEMORY BANKS AND INTEGRATED SERIALIZER/DE-SERIALIZER CIRCUITS FOR SUPPORTING SERIALIZATION/DE-SERIALIZATION OF READ/WRITE DATA IN BURST READ/WRITE MODES, AND RELATED METHODS

(71) Applicant: Microsoft Technology Licensing, LLC, Redmond, WA (US)

(72) Inventors: Pramod Kolar, Cary, NC (US); Stephen E. Liles, Apex, NC (US); Ashish A. Bait, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 135 days.

(21) Appl. No.: 17/847,875

(22) Filed: Jun. 23, 2022

(65) Prior Publication Data
US 2023/0420017 A1 Dec. 28, 2023

(51) Int. Cl.
*G11C 7/22* (2006.01)
*G11C 7/10* (2006.01)

(52) U.S. Cl.
CPC ............ *G11C 7/222* (2013.01); *G11C 7/1048* (2013.01); *G11C 7/1066* (2013.01); *G11C 7/1093* (2013.01)

(58) Field of Classification Search
CPC ..... G11C 7/222; G11C 7/1048; G11C 7/1066; G11C 7/109
See application file for complete search history.

(56) References Cited

U.S. PATENT DOCUMENTS

| 2010/0091537 | A1* | 4/2010 | Best ...................... G11C 5/025 365/220 |
| 2013/0336039 | A1 | 12/2013 | Frans |
| 2018/0343015 | A1 | 11/2018 | Dietrich |
| 2020/0381028 | A1 | 12/2020 | Kim |
| 2021/0073146 | A1 | 3/2021 | Li |
| 2021/0311627 | A1* | 10/2021 | Smith .................. G06F 3/0679 |

OTHER PUBLICATIONS

"International Search Report and Written Opinion issued in PCT Application No. PCT/US23/021829", Mailed Date: Oct. 26, 2023, 23 Pages.
"Invitation to Pay Additional Fees Issued in PCT Application No. PCT/US23/021829", Mailed Date: Sep. 5, 2023, 21 Pages.

* cited by examiner

*Primary Examiner* — Ajay Ojha
(74) *Attorney, Agent, or Firm* — Withrow & Terranova, PLLC

(57) ABSTRACT

Computer memory arrays employing memory banks and integrated serializer/de-serializer circuits for supporting serialization/de-serialization of read/write data in burst read/write modes, and related methods are disclosed. The memory array can include a serialization circuit configured to convert parallel data streams of read data received from separately switched memory banks into a single, serialized, read data stream in a burst read mode. The memory array can also include a de-serialization circuit configured to convert a received, serialized write data stream on an input bus for a write operation into separate, parallel write data streams to be written simultaneously to the memory banks in a burst write mode.

10 Claims, 11 Drawing Sheets

COMPUTER MEMORY ARRAYS EMPLOYING MEMORY BANKS AND INTEGRATED SERIALIZER/DE-SERIALIZER CIRCUITS FOR SUPPORTING SERIALIZATION/DE-SERIALIZATION OF READ/WRITE DATA IN BURST READ/WRITE MODES, AND RELATED METHODS

FIELD OF THE DISCLOSURE

The technology of the disclosure relates to computer memory systems, and more particularly to higher density memory arrays that are split into separate memory banks.

BACKGROUND

Processor-based systems include memory systems to support read and write operations from a central processing unit (CPU) or another processor(s). Memory may be used for data storage as well as to store program code for storing instructions to be executed. Such processor-based systems conventionally employ both cache and non-cache memory, sometimes referred to as "main memory" or "system memory." For example, a CPU may have access to an on-chip local, private cache memory. Multiple CPUs in a processor-based system may also have access to a shared cache memory. The processor-based system also employs a main or system memory that contains memory storage units (i.e., memory bit cells) over the entire physical address space of the processor-based system. Each of these different types of memories employ memory arrays that include memory bit cells typically organized in a row and column structure for storing data. A memory row that contains a memory bit cell in a respective column is accessed to read or write a data word from memory. The memory bit cells can be provided in different technologies of memory, such as static random access memory (RAM) (SRAM) bit cells, and dynamic RAM (DRAM) bit cells.

It is becoming increasingly important to be able to provide larger density memory arrays in memories in processor-based systems with increased bandwidth (i.e., reduced access latency). However, larger density memories may degrade power, performance, and/or area (PPA) requirements. Larger density memories consume more semiconductor die area than smaller memories employing the same memory bit cell technology. Larger density memories may also have increased access latency as compared to smaller cache memories, because the overall memory access latency is based on the access time to the memory bit cells located farthest away from the supporting access circuitry. Also, larger density memories have extended length bit lines that are coupled to the supporting access circuitry (e.g., read sense circuits) to reach the increased number of memory row circuits of the memory array. Extending the length of bit lines increases capacitance on the bit lines thus increasing access latency. Fabrication design rules and related fabrication processes may also limit the overall length of bit lines in memory arrays thus effectively limiting the density of memory arrays regardless of tradeoff acceptance of increased access latency.

One way to increase read and write access performance of higher density memory arrays is to increase size of the transistors in their memory bit cells. Larger transistors support larger gate voltages that in turn result in larger drive current thus allowing bit lines to be charged and discharged faster for read and write accesses. However, increasing the size of transistors in the memory bit cells of a memory array increases the overall area of the memory array. Larger size transistors also have more leakage current thus increasing the overall power consumption by the memory array.

Alternatively, to improve PPA of larger density memories, the memory array could be split into multiple, smaller-sized memory banks. For example, FIG. 1 illustrates a memory array 100 that includes two (2) memory sub-arrays, the first and second memory sub-arrays 102(1), 102(2). The second memory sub-array 102(2) is shown in more detail in FIG. 1, but has the same structure as the first memory sub-array 102(1). Using the second memory sub-array 102(2) as an example, the second memory sub-array 102(2) is further split into two (2) memory banks 104(1), 104(2) in an interleaved bank arrangement to reduce bit errors. In this example, the first memory bank 104(1) is configured to store data for odd memory addresses, and the second memory bank 104(2) is configured to store data for even memory addresses. The total memory capacity of the smaller-sized memory banks 104(1), 104(2) is designed to be the desired overall memory capacity for the memory sub-array 102(2). Splitting the memory sub-array 102(2) into the separate memory banks 104(1), 104(2) reduces the distance between its outer most memory bit cells in each memory bank 104(1), 104(2) and local access circuitry 106 (e.g., column multiplexing circuitry and column sense amplifiers), which can reduce access latency. Each memory bank 104(1), 104(2) also has its own dedicated bit lines that are reduced in length more than they otherwise would be if the memory sub-array 102(2) was not split into the separate memory banks 104(1), 104(2). Reduced length bit lines reduces bit line capacitance, which in turn reduces bit line charging time for reduced memory access latency and power consumption. The memory banks 104(1), 104(2) share the local access circuitry 106 to save area and power consumption, but at the expense of only one of the memory banks 104(1), 104(2) being accessible at a given time.

Each memory bank 104(1), 104(2) in the memory sub-array 102(2) in FIG. 1 can be designed to be accessed at a lower frequency to further reduce power. However, only one of the two (2) memory banks 104(1), 104(2) in the memory sub-array 104(2) can be accessed by a global input/output (I/O) circuit 108 at a time to avoid data conflicts on common input bus 110 and output bus 112. A memory controller can be configured to control a global control circuit 114 to control an input multiplexer 116 to control the forwarding of write data WD from the input bus 110 to a selected memory bank 104(1), 104(2) in a back and forth "ping-pong" fashion. This can effectively provide twice the access frequency to be equivalent to a non-banked memory sub-array operating at twice the lower frequency. However, the shared input bus 110 to the memory banks 104(1), 104(2) will increase power consumption, because even though write data WD will only be written to a selected memory bank 104(1), 104(2) that is active, the memory address is received by each memory bank 104(1), 104(2) thereby activating circuitry in both the active and inactive memory banks 104(1), 104(2). Also, write memory glitching can occur when controlling the input multiplexer 116 to switch writing the write data WD between the different memory banks 104(1), 104(2). Adding delay to the timing of write accesses to the memory banks 104(1), 104(2) and the switching of the input multiplexer 116 to forward the write data WD from the input bus 110 to the selected memory bank 104(1), 104(2) can avoid write memory glitches, but at the cost of reducing the write bandwidth of the memory sub-array 102(2).

A memory controller can be configured to control the global control circuit 114 to control an output multiplexer 118 to control the forwarding of read data RD onto the output bus 112 from a selected memory bank 104(1), 104(2). Because only one memory bank 104(1), 104(2) can be selected at a time, only read data RD from the selected memory bank 104(1), 104(2) can be asserted onto the output bus 112 at a given time. The global control circuit 114 could be configured to also request read data RD from each memory bank 104(1), 104(2) in a ping-pong fashion. However, read memory glitching can occur when controlling the output multiplexer 118 to switch the forward of read data RD from the different memory banks 104(1), 104(2). Adding delay to the timing of read accesses to the memory banks 104(1), 104(2) and the switching of the output multiplexer 118 to assert the read data RD from the corresponding memory bank 104(1), 104(2) onto the output bus 112 can avoid read memory glitches, but at the cost of reducing the read bandwidth of the memory sub-array 102(2).

Another way to reduce power consumption in the memory sub-array 102(2) that is split into the two (2) memory banks 104(1), 104(2) in FIG. 1 is to further split each of the memory banks 104(1), 104(2) into multiple memory sub-banks. By splitting a memory bank 104(1), 104(2) into memory sub-banks, each memory sub-bank can be provided with its own dedicated bit lines. Thus, the length of the bit lines of an inner memory sub-bank(s) located closer to the local access circuitry 106 is further reduced than it otherwise would be if a memory bank were not split into memory sub-banks. This can allow the memory sub-banks to be accessed at a higher frequency rate for improved access performance. However, some of the power consumption savings realized through memory sub-banking is offset by increased power of the data input bus 110 that carries write data WD for the accessed memory bank 104(1), 104(2) even though such write data WD may only be written to one of the memory sub-banks within a memory bank 104(1), 104(2). Power consumption and area may also be increased in the memory array 100 wherein memory banks that are further split into memory sub-banks due to included circuitry to manage a more complex addressing scheme to separately address each of the memory sub-banks (e.g., column multiplexing circuits in the local access circuitry 106 with a greater number of inputs for the separate bit lines from each memory sub-bank).

It is desired to find a way to provide memory banking and/or sub-banking of a memory array in a memory system to conserve area and reduce power consumption, but not at the expense of reduced memory bandwidth.

SUMMARY

Exemplary aspects disclosed herein include computer memory arrays employing memory banks and integrated serializer/de-serializer circuits for supporting serialization/de-serialization of read/write data in burst read/write modes. Related methods are also disclosed. The memory array is split into multiple memory banks to split up the memory capacity among the multiple memory banks. For example, a memory array may be split into two (2) memory banks wherein each memory bank is configured to store data for respective even and odd memory locations. Memory banking reduces the overall length of bit lines and the distance between outer most memory bit cells in a given memory bank and access circuitry to improve memory access latency and reduce power consumption. Because only one memory bank in the memory array is typically accessible at a time for read operations to avoid read data conflicts on the output bus, a memory controller may be configured to switch back and forth between different memory banks for read operations. However, the frequency (i.e., data rate) of each memory bank may need to be reduced to avoid read glitches due to back and forth switching between each memory bank. In exemplary aspects, to avoid the need to decrease the frequency of the memory banks while avoiding or reducing read glitches, and while still realizing the reduced power consumption benefits from memory banking, the memory array includes a serialization circuit. The serialization circuit is configured to convert parallel data streams of read data received from separately switched memory banks into a single, serialized, read data stream to be provided on the output bus in a burst read mode. In the example of a memory array having two (2) memory banks, the serialization circuit can provide the serialized read data stream on the output bus over two (2) back-to-back clock cycles in a high bandwidth, burst read mode thereby effectively doubling the output data rate on the output bus, and increasing the read access bandwidth (e.g., bits per second) of the memory array. The serialization circuit can also include circuitry that reduces or avoids read glitches on the output bus during the switching between memory banks to be able to realize the increased output data rate. The serialization circuit can also be configured to operate in a regular, non-burst read mode wherein read data from an addressed memory bank is coupled to the output bus without serializing read data from multiple memory banks.

In another exemplary aspect, the memory array also includes a de-serialization circuit that is configured to convert a received, serialized write data stream on an input bus for a write operation into separate, parallel write data streams to be written simultaneously to the memory banks in a burst write mode. The de-serialization circuit can be configured to write the separate data streams into respective memory banks at half the frequency of the input bus, thus allowing more time to switch between the memory banks to write the write data to the multiple memory banks to reduce or avoid write data glitching. In the example of the memory array including two (2) memory banks, the de-serialization circuit can be configured to store the received write data over two (2) clock cycles in a burst write mode. As an example, the separate write lines to activate the write operation for each memory bank can be setup by the second clock cycle to then allow the separate write data streams to be written simultaneously to each memory bank. In this manner, because the de-serialization circuit allows the parallelized write data streams to be written to the memory banks simultaneously, the overall write bandwidth of the memory array is not reduced from the frequency of the input bus. In this manner, the write bandwidth of the memory array does not have to be reduced from the frequency of the input bus to write data between switched memory banks in the memory array. The de-serialization circuit can also be configured to operate in a regular, non-burst write mode where the received write data is written to only one addressed memory bank at a time.

In another exemplary aspect, the memory banks in the memory array can be further split into memory sub-banks to reduce access latency and power consumption. By splitting a memory bank into memory sub-banks, each memory sub-bank can be provided with its own dedicated bit lines to allow access frequency to be increased for improved access performance. The separate, dedicated bit lines for each memory sub-bank are independently coupled to common access circuitry that can be controlled based on the accessed memory sub-bank. Power consumption by the memory bit cells is reduced by all the memory bit cells not being coupled to the same bit lines. In this manner, memory sub-banking can further reduce access latency at lower dynamic energy consumption. In another exemplary aspect, the bit lines to an outer memory sub-bank in a memory bank can be realized in a die layout as flying bit lines that extend to a different metal layer than bit line in an inner memory sub-bank to avoid the need to provide specialized memory bit cell circuits for each of the memory bit cells in the inner memory sub-bank(s).

In this regard, in one exemplary aspect, a memory array is provided. The memory array comprises a first output bus, a first memory bank comprising a first read output, a second memory bank comprising a second read output, and a first read driver circuit. The first read driver circuit is clocked by a source clock signal. The first read driver circuit is configured to access a first read data stored at a first memory address in the first memory bank to be asserted on the first read output, and access second read data stored at a second memory address in the second memory bank to be asserted on the second read output. The memory array also comprises a serialization circuit. The serialization circuit is configured to assert the first read data on the first output bus in response to a first clock cycle of the source clock signal, and assert the second read data on the first output bus after the assertion of the first read data on the first output bus, in response to the second clock cycle of the source clock signal immediately following the first clock cycle of the source clock signal.

In this regard, in another exemplary aspect, a method of serializing read data from a plurality of memory banks in a memory array is provided. The method comprises receiving a source clock signal. The method also comprises accessing a first read data stored at a first memory address in a first memory bank in a first memory array based on the source clock signal. The method also comprises asserting the first read data on a first read output of the first memory bank. The method also comprises accessing second read data stored at a second memory address in a second memory bank in the first memory array. The method also comprises asserting the second read data on a second read output of the second memory bank. The method also comprises asserting the first read data on a first output bus in response to a first clock cycle of a source clock signal. The method also comprises asserting the second read data on the first output bus after the asserting of the first read data on the first output bus, in response to the second clock cycle of the source clock signal immediately following the first clock cycle of the source clock signal.

In this regard, in another exemplary aspect, a memory array is provided. The memory array comprises a first input bus, a first memory bank, a second memory bank, a first write output coupled to the first memory bank, and a second write output coupled to the second memory bank. The memory array also comprises a first write driver circuit clocked by a source clock. The first write driver circuit is configured to assert a first write data stream on the first input bus to be written starting at a first memory address in the memory array. The memory array also comprises a de-serialization circuit. The de-serialization circuit is configured to receive the first write data stream from the first input bus in response to a first clock cycle of a source clock signal. The de-serialization circuit is also configured to de-multiplex first write data and second write data from the first write data stream. The de-serialization circuit is also configured to assert the first write data of the first write data stream on the first write output to be written to the first memory address in the first memory bank in response to a second clock cycle of the source clock signal immediately following the first clock cycle of the source clock signal. The de-serialization circuit is also configured to assert the second write data of the first write data stream on the second write output to be written to a second memory address based on the first memory address in the second memory bank in response to the second clock cycle of the source clock signal.

In this regard, in another exemplary aspect, a method of de-serializing write data from an input bus to be written to plurality of memory banks in a memory array is provided. The method comprises receiving a source clock signal. The method also comprises asserting a first write data stream on a first input bus to be written starting at a first memory address in a memory array based on the source clock signal. The method also comprises receiving the first write data stream from the first input bus in response to a first clock cycle of a source clock signal. The method also comprises de-multiplexing first write data and second write data from the first write data stream. The method also comprises asserting the first write data of the first write data stream on a first write output coupled to a first memory bank in the memory array to be written to the first memory address in the first memory bank in response to a second clock cycle of the source clock signal immediately following the first clock cycle of the source clock signal. The method also comprises asserting the second write data of the first write data stream on a second write output coupled to a second memory bank in the memory array to be written to a second memory address based on the first memory address in the second memory bank in response to the second clock cycle of the source clock signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
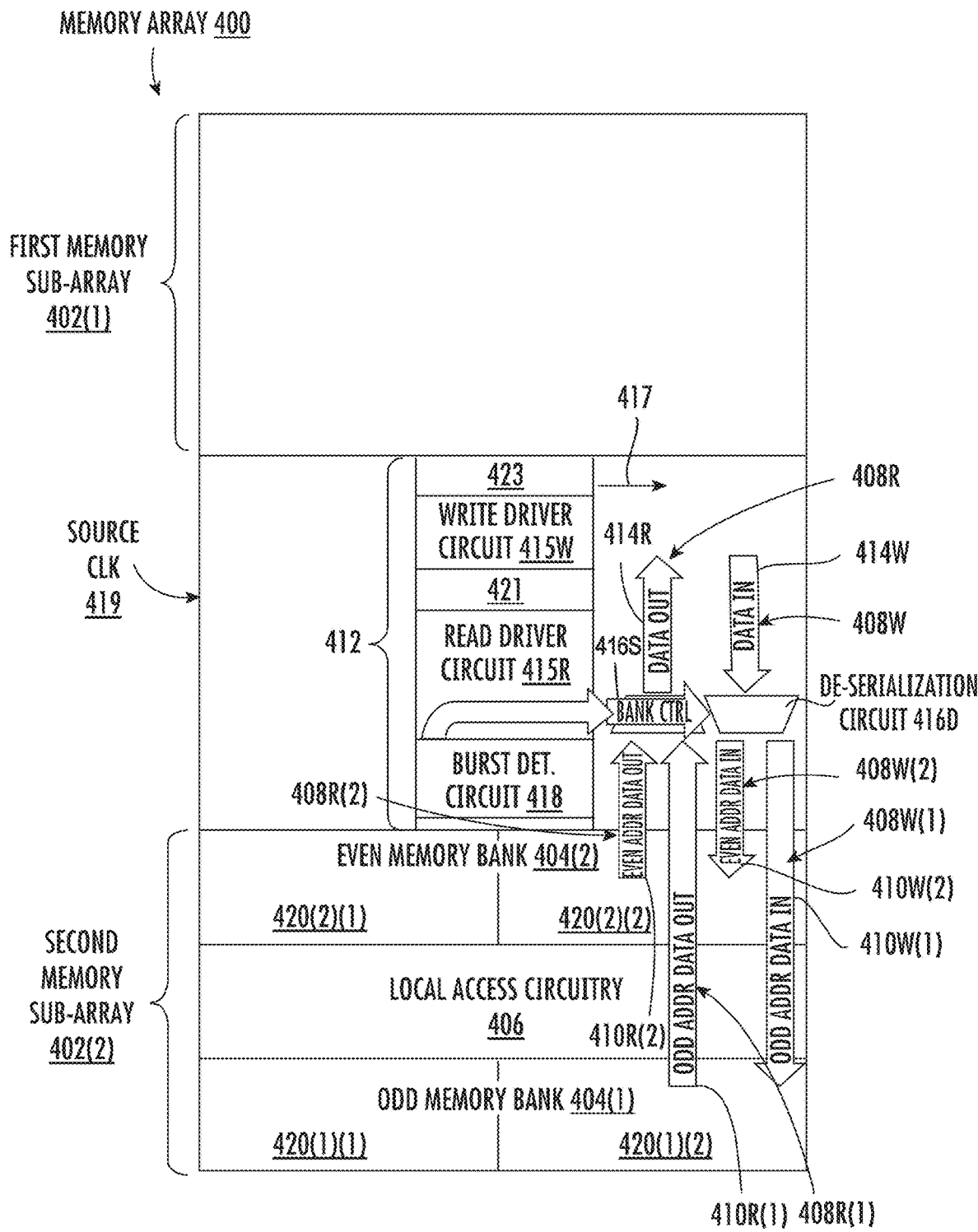
Figure 5:
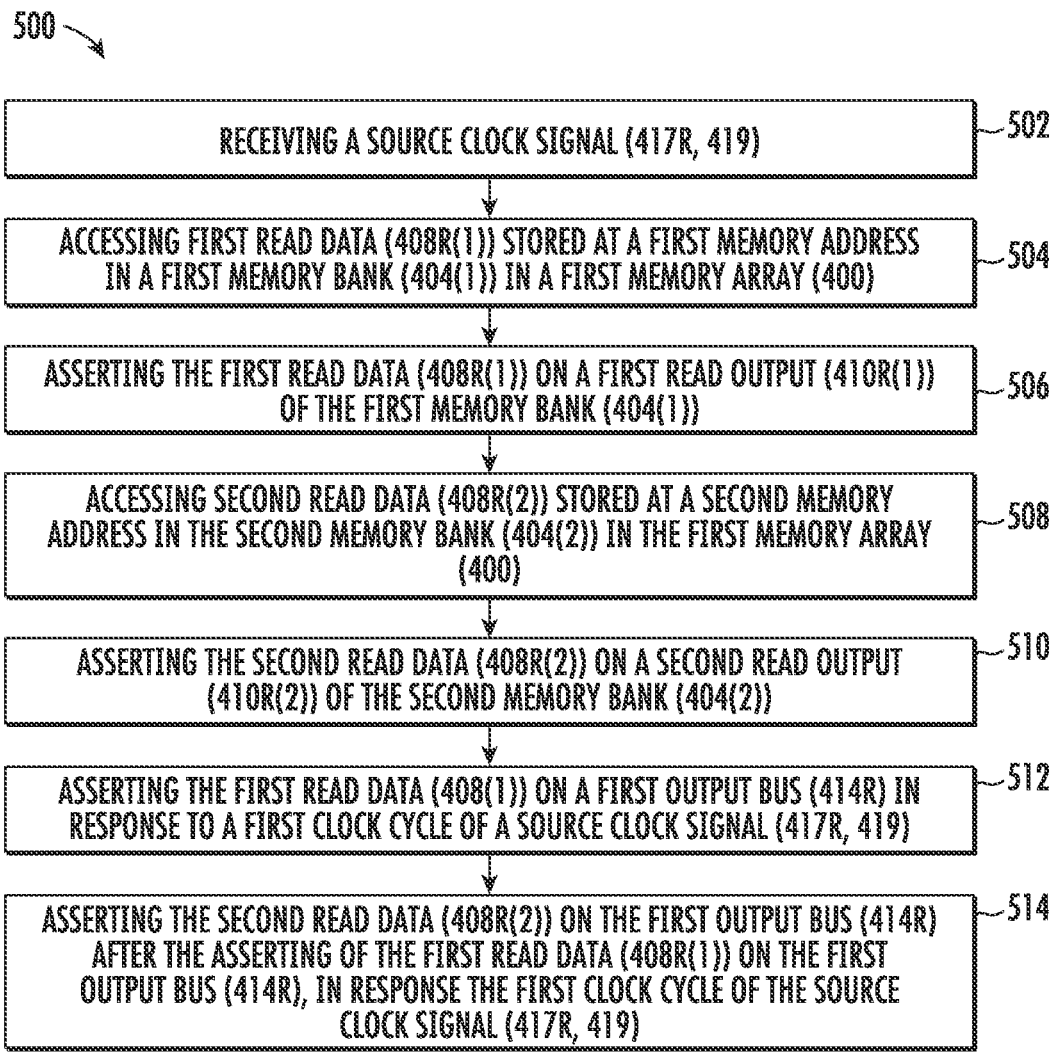
Figure 6:
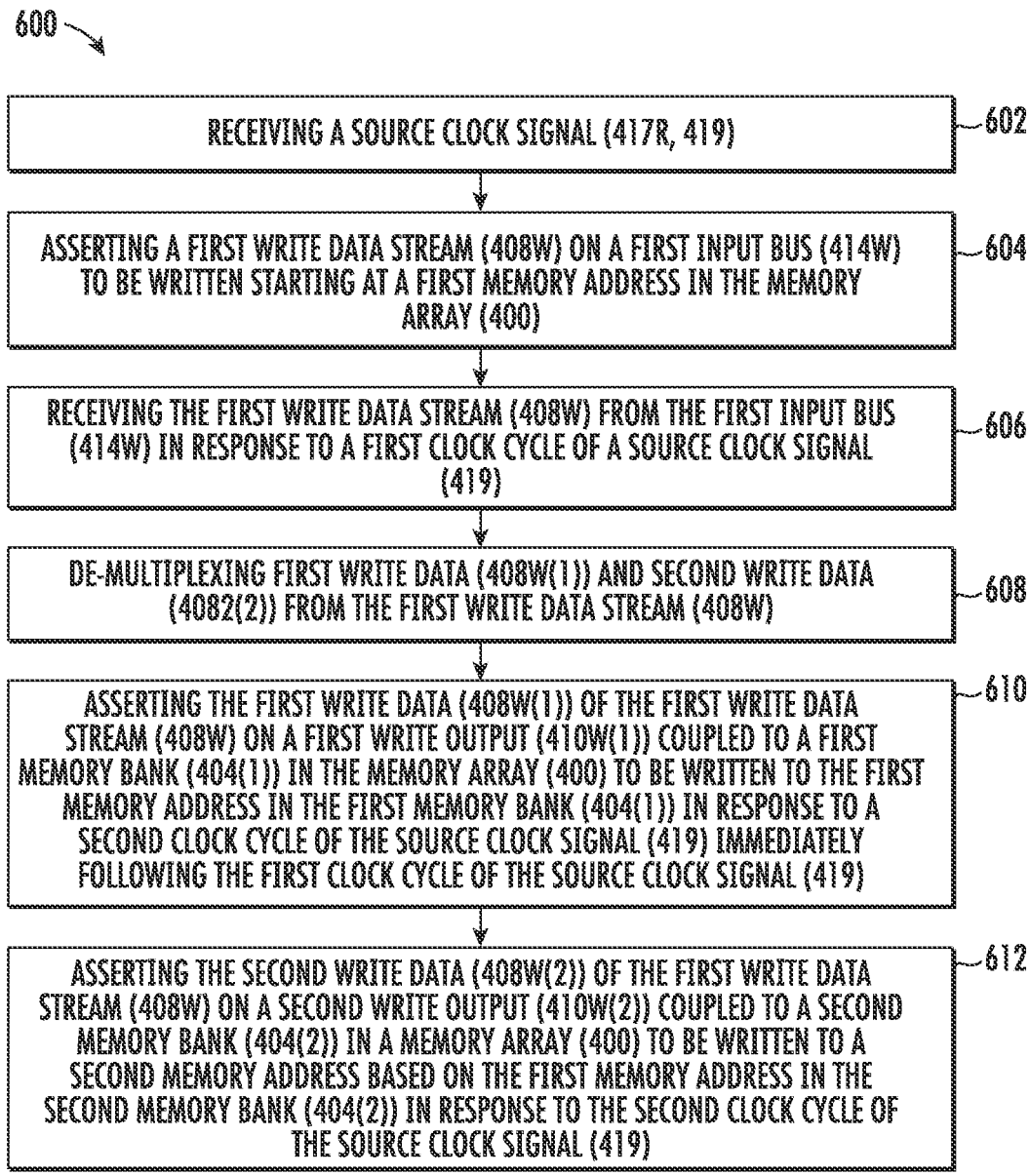
Figure 7:
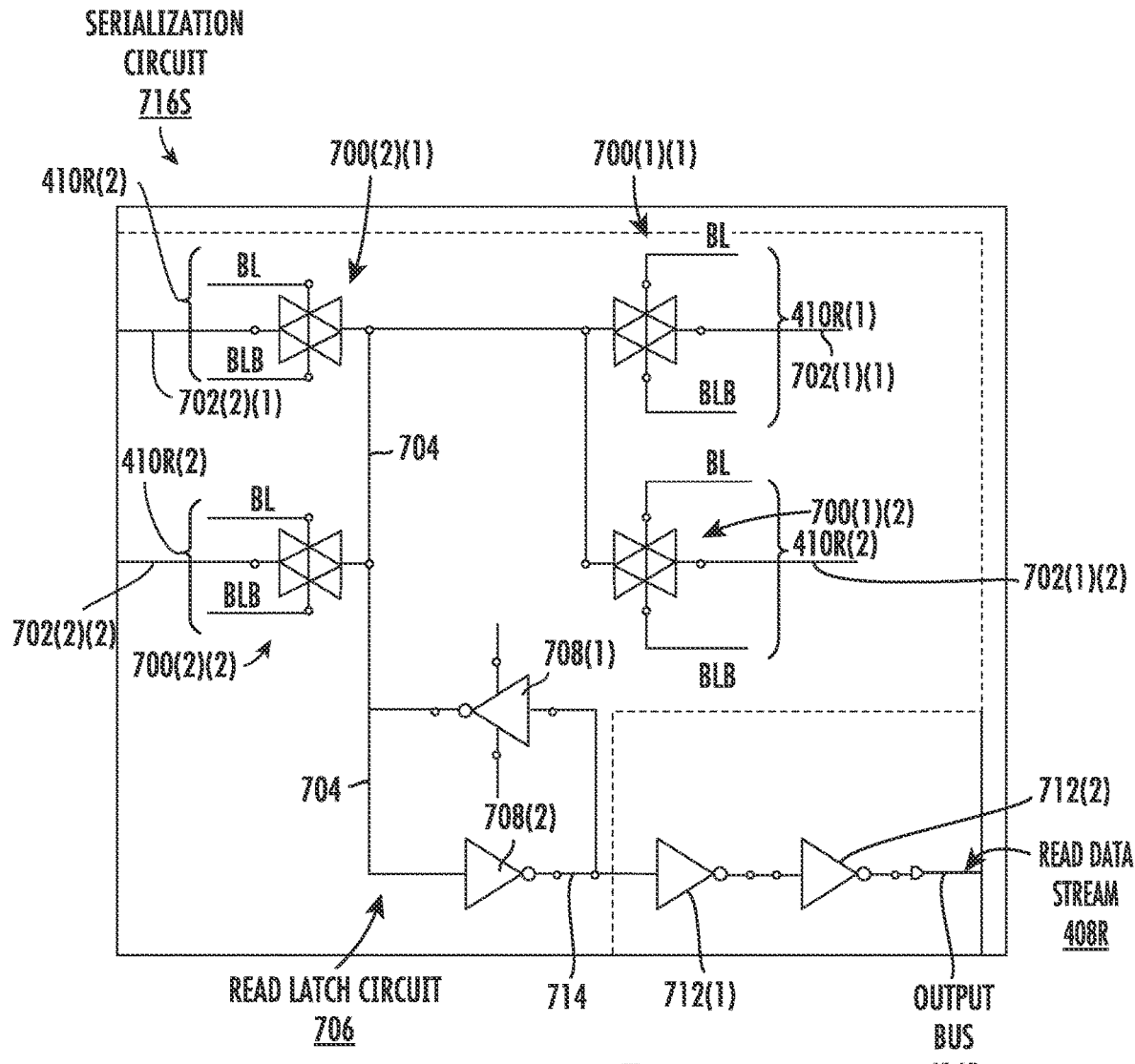
Figure 8:
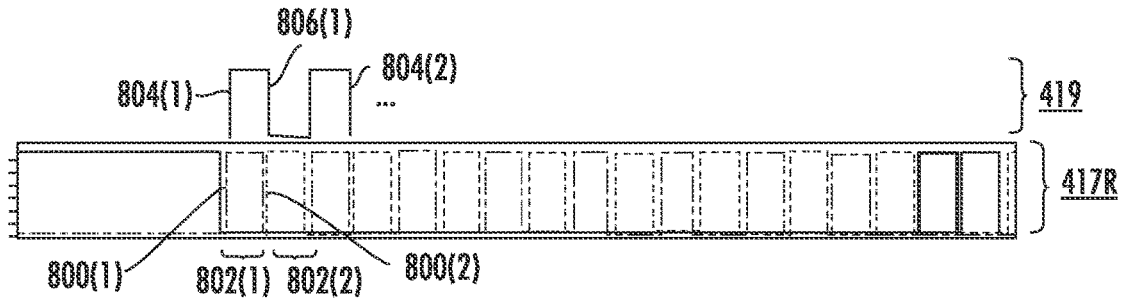
Figure 9:
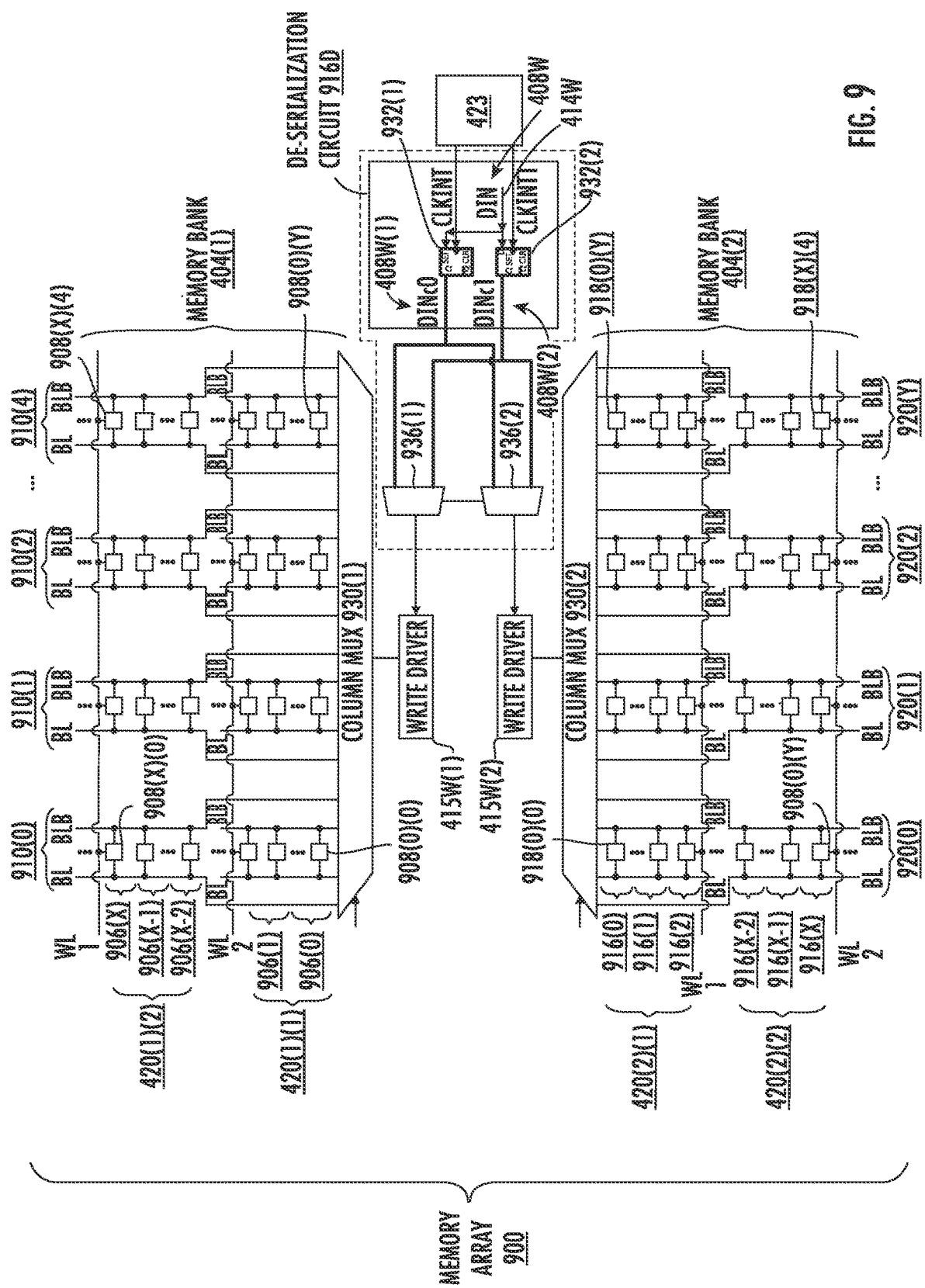
Figure 10:
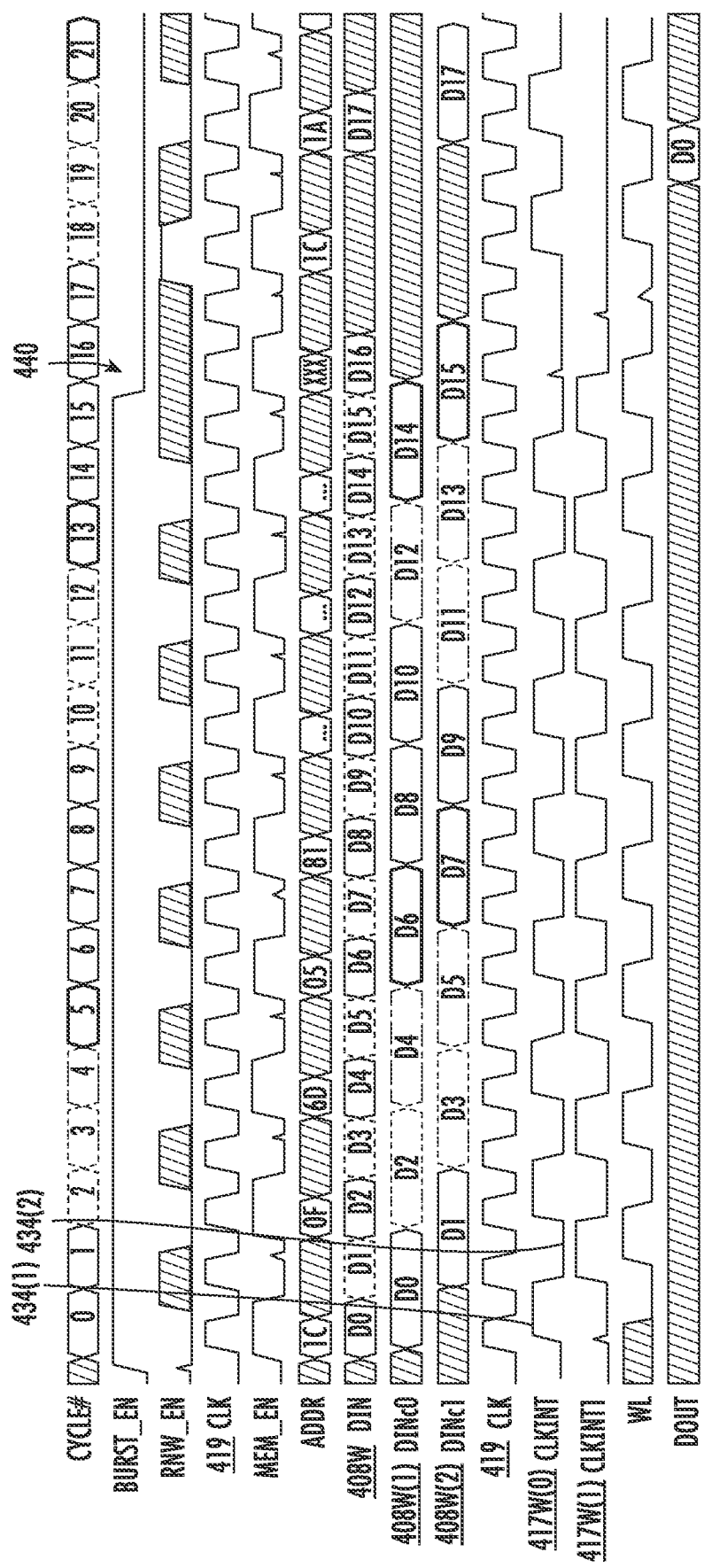
Figure 11:
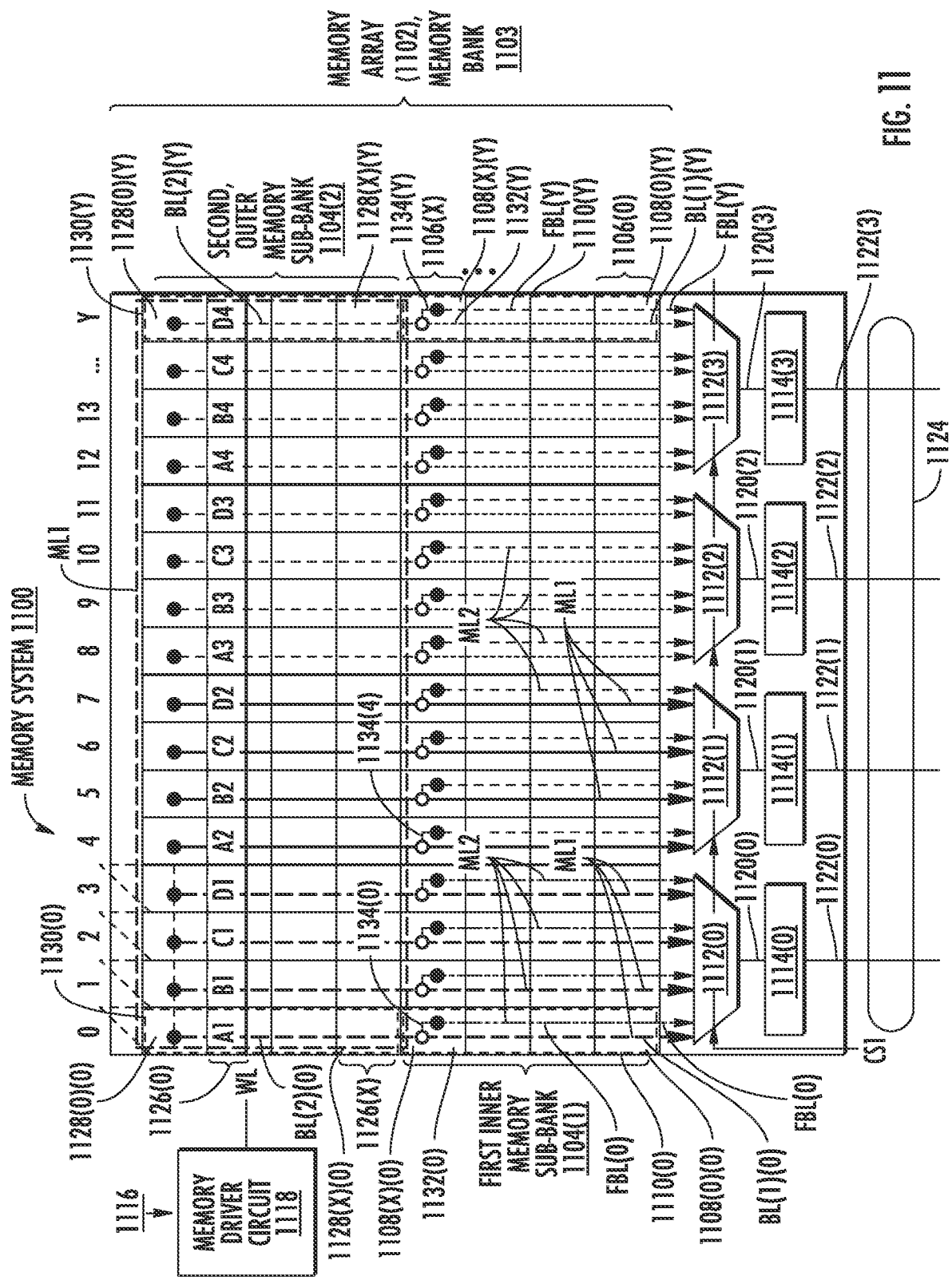
Figure 12:
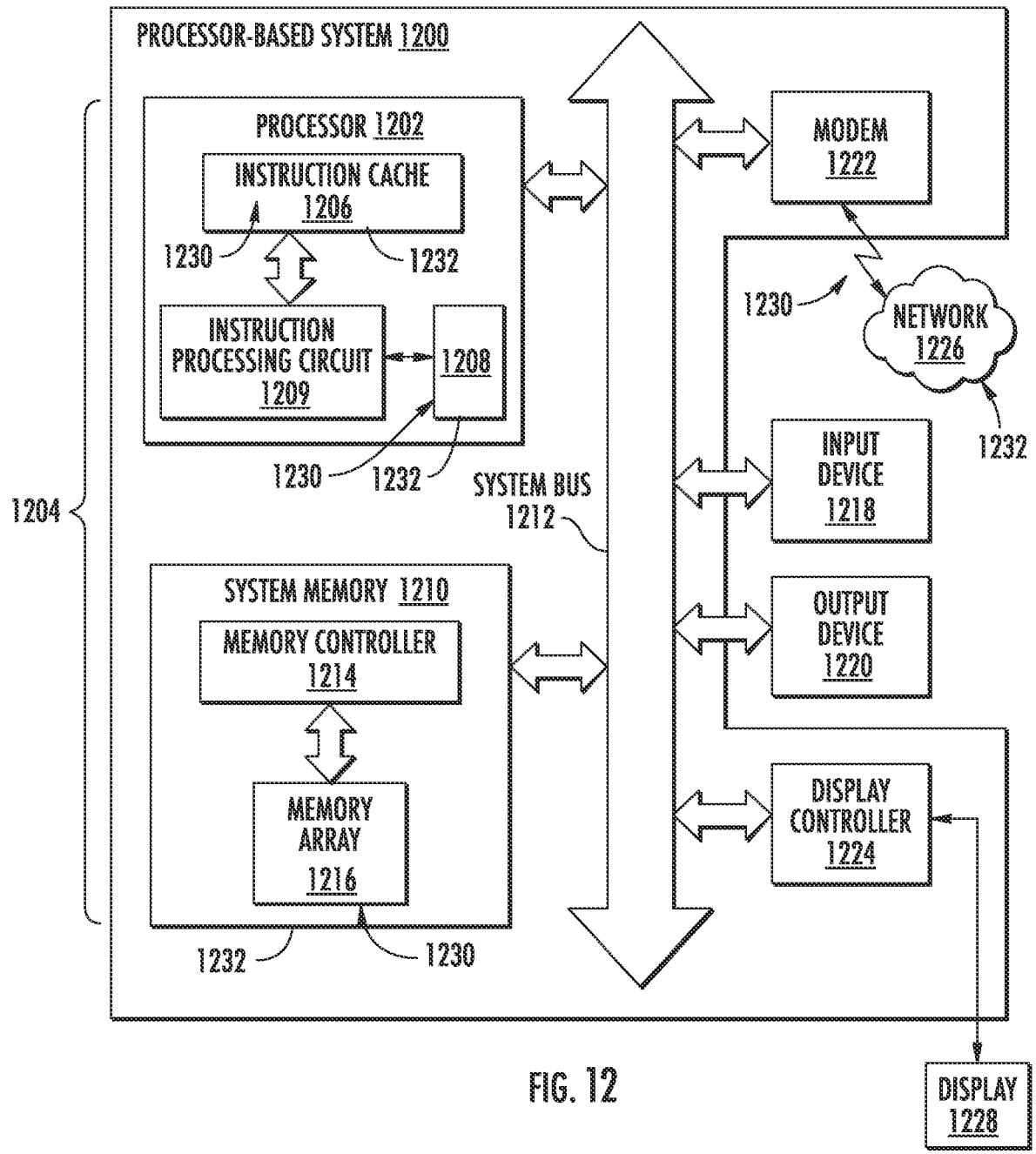

FIG. 4 is an exemplary memory array that includes multiple memory banks, includes an integrated serialization circuit configured to convert parallel data streams of read data received from separately switched memory banks into a single, serialized, read data stream to be provided on the output bus in a burst read mode, and/or includes a de-serialization circuit configured to convert a received, serialized write data stream on an input bus for a write operation into separate, parallel write data streams to be written simultaneously to the memory banks in a burst write mode;

FIG. 5 is a flowchart illustrating an exemplary process of a serialization circuit, including but not limited to the serialization circuit in FIG. 4, converting parallel data streams of read data received from separately switched memory banks into a single, serialized, read data stream to be provided on the output bus in a burst read mode:

FIG. 6 is a flowchart illustrating an exemplary process of a de-serialization circuit converting a received, serialized write data stream on an input bus for a write operation into separate, parallel write data streams to be written simultaneously to the memory banks in a burst write mode:

FIG. 7 is a circuit diagram of an exemplary serialization circuit provided in a memory array, including but not limited to the memory array in FIG. 4, which includes a plurality of read multiplexer circuits each coupled to a respective memory sub-bank to receive read data in a read operation from its respective memory sub-bank in a parallel arrangement, and a latch circuit configured to latch the parallel read data into a single, serialized, read data stream in a burst read mode:

FIG. 8 is a signal diagram illustrating exemplary non-overlapping clock signals generated by a clock generation circuit for controlling the read multiplexer circuits in the serialization circuit in FIG. 6 to allow the latch circuit to serialize the parallel read data into a single, serialized, read data stream in a burst read mode:

FIG. 9 is a circuit diagram of an exemplary de-serialization circuit provided in a memory array, including but not limited to the memory array in FIG. 4, configured to de-multiplex a received serialized write data stream into separate, parallel write data to be written simultaneously to the separate memory banks in a burst write mode:

FIG. 10 is a signal diagram illustrating exemplary signals for controlling the data inputs to the write latch circuits and the write de-multiplexer circuits to de-multiplex a received serialized write data stream into separate, parallel write data to be written simultaneously to the separate memory banks in a burst write mode:

FIG. 11 is an exemplary memory bank in an exemplary column multiplex four (4) (CM4) interleave arrangement that includes a first, inner memory sub-bank coupled to first bit lines coupled to access circuitry, and a second, outer memory sub-bank coupled to second bit lines that are further coupled to flying bit lines coupled to the access circuitry: and FIG. 12 is a block diagram of an exemplary processor-based system that can be provided in an integrated circuit (IC) chip, wherein the processor-based system includes a processor and a memory system that includes a memory array that includes multiple memory banks, includes an integrated serialization circuit configured to convert parallel data streams of read data received from separately switched memory banks in a memory sub-array into a single, serialized, read data stream to be provided on the output bus in a burst read mode, and/or includes a de-serialization circuit configured to convert a received, serialized write data stream on an input bus for a write operation into separate, parallel write data streams to be written simultaneously to the memory banks in a memory sub-array in a burst write mode, including, without limitation, the memory arrays and exemplary circuits in FIGS. 4-7, 9-10, and 12.

DETAILED DESCRIPTION

Exemplary aspects disclosed herein include computer memory arrays employing memory banks and integrated serializer/de-serializer circuits for supporting serialization/de-serialization of read/write data in burst read/write modes. Related methods are also disclosed. The memory array is split into multiple memory banks to split up the memory capacity among the multiple memory banks. For example, a memory array may be split into two (2) memory banks wherein each memory bank is configured to store data for respective even and odd memory locations. Memory banking reduces the overall length of bit lines and the distance between outer most memory bit cells in a given memory bank and access circuitry to improve memory access latency and reduce power consumption. Because only one memory bank in the memory array is typically accessible at a time for read operation operations to avoid read data conflicts on the output bus, a memory controller may be configured to switch back and forth between different memory banks for read operations. However, the frequency (i.e., data rate) of each memory bank may need to be reduced to avoid read glitches due to back and forth switching between each memory bank. In exemplary aspects, to avoid the need to decrease the frequency of the memory banks while avoiding or reducing read glitches, and while still realizing the reduced power consumption benefits from memory banking, the memory array includes a serialization circuit. The serialization circuit is configured to convert parallel data streams of read data received from separately switched memory banks into a single, serialized, read data stream to be provided on the output bus in a burst read mode. In the example of a memory array having two (2) memory banks, the serialization circuit can provide the serialized read data stream on the output bus over two (2) back-to-back clock cycles in a high bandwidth, burst read mode thereby effectively doubling the output data rate on the output bus, and increasing the read access bandwidth (e.g., bits per second) of the memory array. The serialization circuit can also include circuitry that reduces or avoids read glitches on the output bus during the switching between memory banks to be able to realize the increased output data rate. The serialization circuit can also be configured to operate in a regular, non-burst read mode wherein read data from an addressed memory bank is coupled to the output bus without serializing read data from multiple memory banks.

In another exemplary aspect, the memory array also includes a de-serialization circuit that is configured to convert a received, serialized write data stream on an input bus for a write operation into separate, parallel write data streams to be written simultaneously to the memory banks in a burst write mode. The de-serialization circuit can be configured to write the separate data streams into respective memory banks at half the frequency of the input bus, thus allowing more time to switch between the memory banks to write the write data to the multiple memory banks to reduce or avoid write data glitching. In the example of the memory array including two (2) memory banks, the de-serialization circuit can be configured to store the received write data over two (2) clock cycles in a burst write mode. As an example, the separate write lines to activate the write operation for each memory bank can be setup by the second clock cycle to then allow the separate write data streams to be written simultaneously to each memory bank. In this manner, because the de-serialization circuit allows the parallelized write data streams to be written to the memory banks simultaneously, the overall write bandwidth of the memory array is not reduced from the frequency of the input bus. In this manner, the write bandwidth of the memory array does not have to be reduced from the frequency of the input bus to write data between switched memory banks in the memory array. The de-serialization circuit can also be configured to operate in a regular, non-burst write mode where the received write data is written to only one addressed memory bank at a time.

Figure 1:
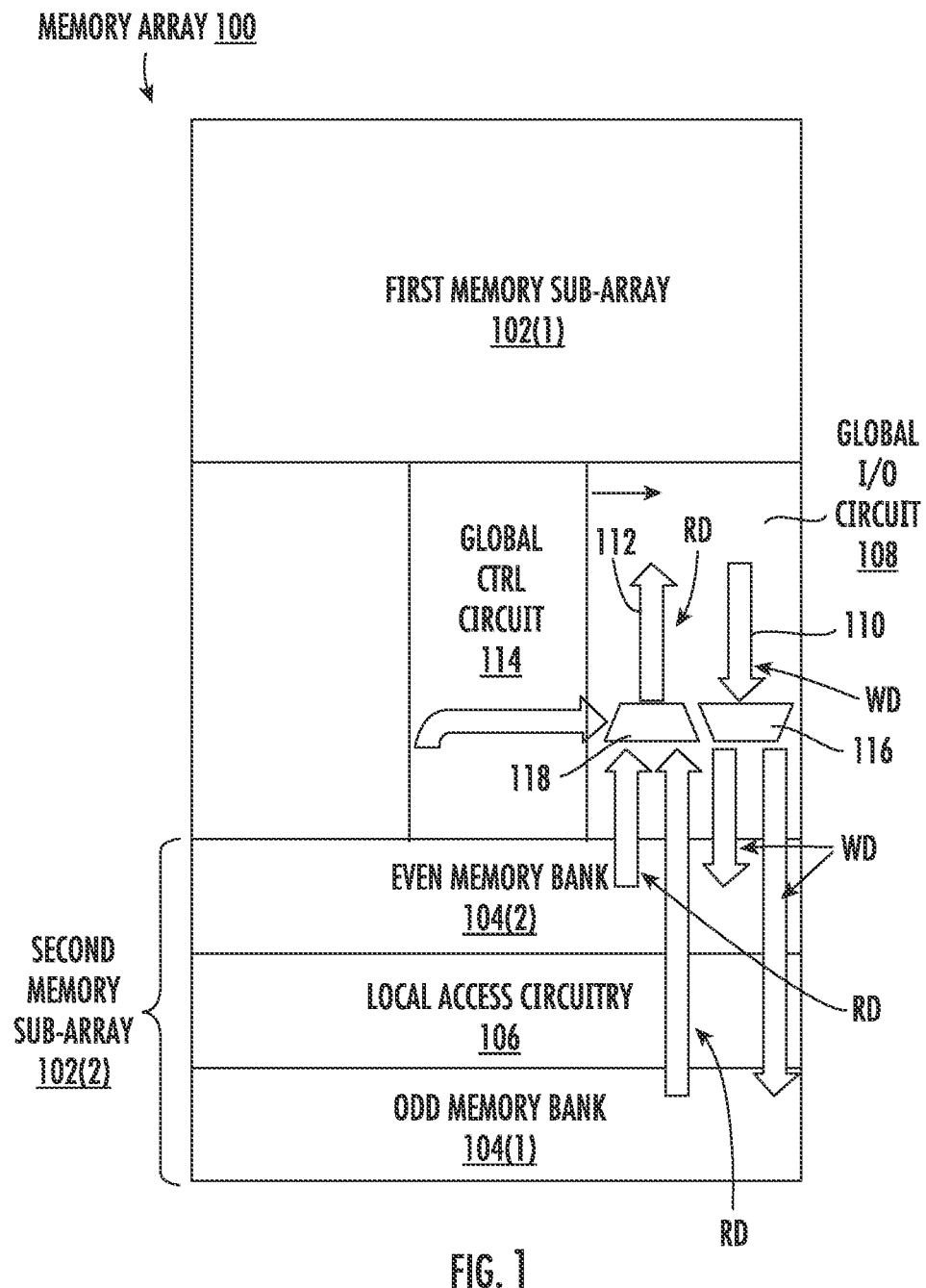
FIG. 1 is an exemplary memory array that includes two (2) memory sub-arrays that each include two (2) memory banks configured to store data for respective even and odd memory addresses.
Figure 2:
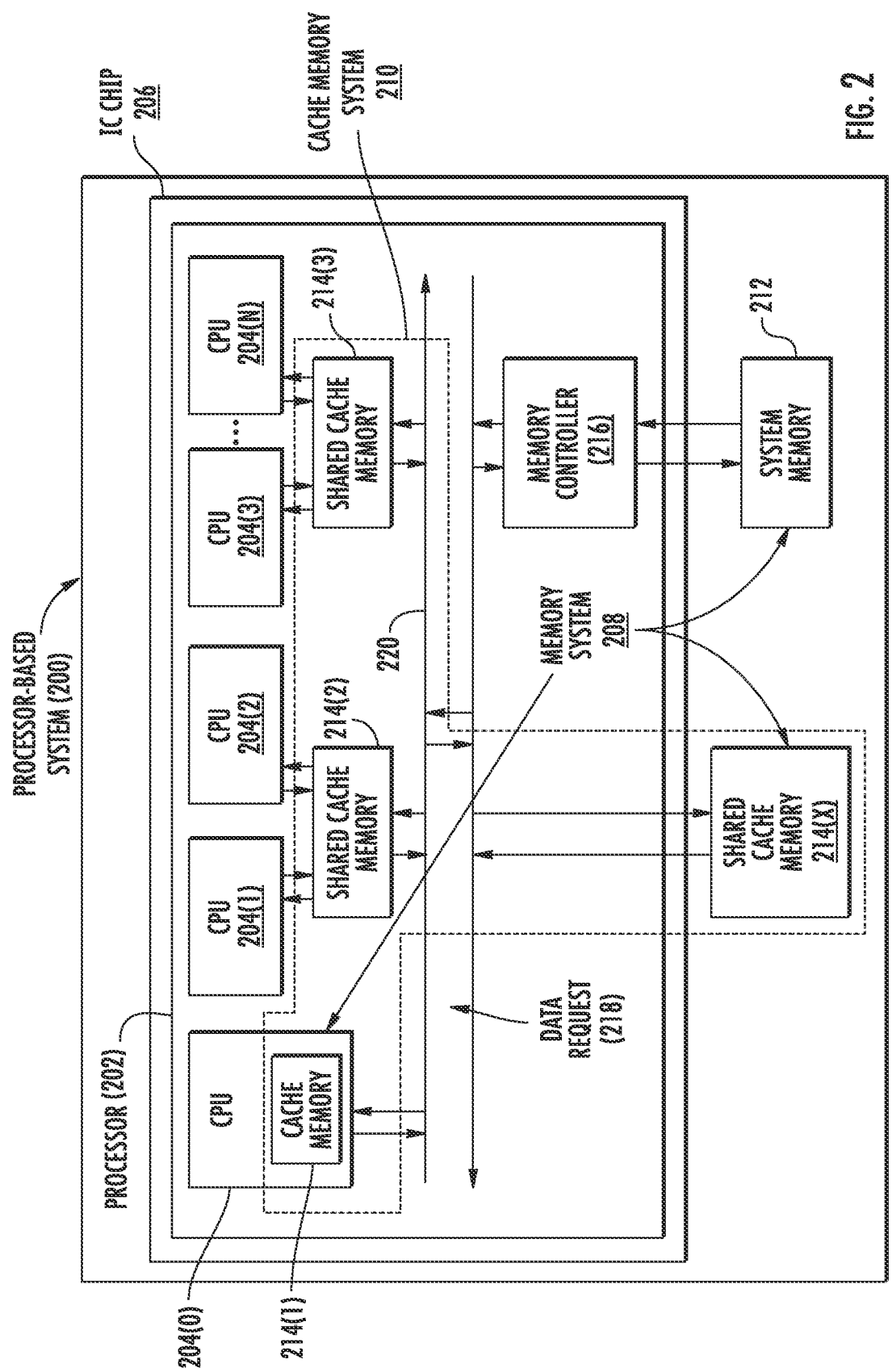
FIG. 2 is an exemplary processor-based system that includes a plurality of central processing units (CPUs) each configured to access local and shared cache memory, and system memory to read and write data.

In this regard, FIG. 2 is a diagram of an exemplary processor-based system 100 that includes a processor 202 and a memory system 208. As discussed in more detail below; starting at FIG. 4, the memory system 208 can include memory arrays that can include an integrated serialization circuit configured to convert parallel data streams of read data received from separately switched memory banks into a single, serialized, read data stream to be provided on the output bus in a burst read mode. As also discussed in more detail below, starting at FIG. 4, the memory system 208 can include memory arrays that can also include a de-serialization circuit configured to convert a received, serialized write data stream on an input bus for a write operation into separate, parallel write data streams to be written simultaneously to the memory banks in a burst write mode. Before such exemplary serialization and de-serialization circuits, the exemplary processor-based system 200 in FIG. 2 with its memory system 208 and an exemplary memory array in FIG. 3 that does not include integrated serialization and de-serialization circuits is first described below.

In this regard, with reference to FIG. 2, the processor 202 in the processor-based system 200 includes one or more respective CPUs 204(0)-204(N), wherein 'N' is a positive whole number representing the number of CPUs included in the processor 202. The processor 202 can be packaged in an integrated circuit (IC) chip 206. The CPUs 204(0)-204(N) in the processor 202 are configured to issue memory requests (i.e., data read and data write requests) to a memory system 208. The memory system 208 includes a cache memory system 210 and a system memory 212. The system memory 212 is a memory that is fully addressable by the physical address (PA) space of the processor-based system 200. For example, the system memory 212 may be a dynamic random access memory (DRAM) provided in a separate DRAM chip. The cache memory system 210 in the memory system 208 includes one or more cache memories 214(1)-214(X), where 'X' is a positive whole number representing the number of cache memories included in the processor 202. The cache memories 214(2)-214(X) may be at different hierarchies in the processor-based system 200 and that are logically located between the CPUs 204(0)-204(N) and the system memory 212. A memory controller 216 controls access to the system memory 212. For example, a CPU 204(0)-204(N) as a requesting device may issue a data request 218 to read data in response to processing a load instruction. The data request 218 includes a target address of the data to be read from memory. Using CPU 204(0) as an example, if the requested data is not in a private cache memory 214(1) (i.e., a cache miss to cache memory 214(1)) which may be considered a level one (L1) cache memory, the private cache memory 214(1) sends the data request 218 over an interconnect bus 220 in this example to a shared cache memory 214(X) shared with all of the CPUs 204(0)-204(N), which may be a level 3 (L3) cache memory. The requested data in the data request 218 is eventually either fulfilled in a cache memory 214(1)-214(X) or the system memory 212 if not contained in any of the cache memories 214(1)-214(X).

The cache memories 214(1)-214(X) and/or the system memory 212 in the memory system 208 in FIG. 2 can employ memory arrays that include memory bit cells typically organized in a row and column structure for storing data. A memory row that contains a memory bit cell in a respective column is accessed to read or write a data word from memory. The memory bit cells can be provided in different technologies of memory, such as static random access memory (RAM) (SRAM) bit cells, and dynamic RAM (DRAM). As another example, the system memory 112 may be implemented with multiple large sized memory arrays using multiple memory banks to improve memory performance and power consumption. Providing multiple memory banks in a memory in the memory system 208 can split the memory capacity among different arrays that can each be accessed independently by the CPUs 204(1)-204(N). Also, providing separate memory banks in the memory system 208 means that the power consumption can be managed for each memory bank independently of another memory bank. Thus, for example, if software or data is persistent in one portion of memory, but not another, these separate portions of memory can be split into separate memory banks so that each can be separately powered down or idled to conserve power without affecting the other which may be fully powered for memory accesses.

Figure 3:
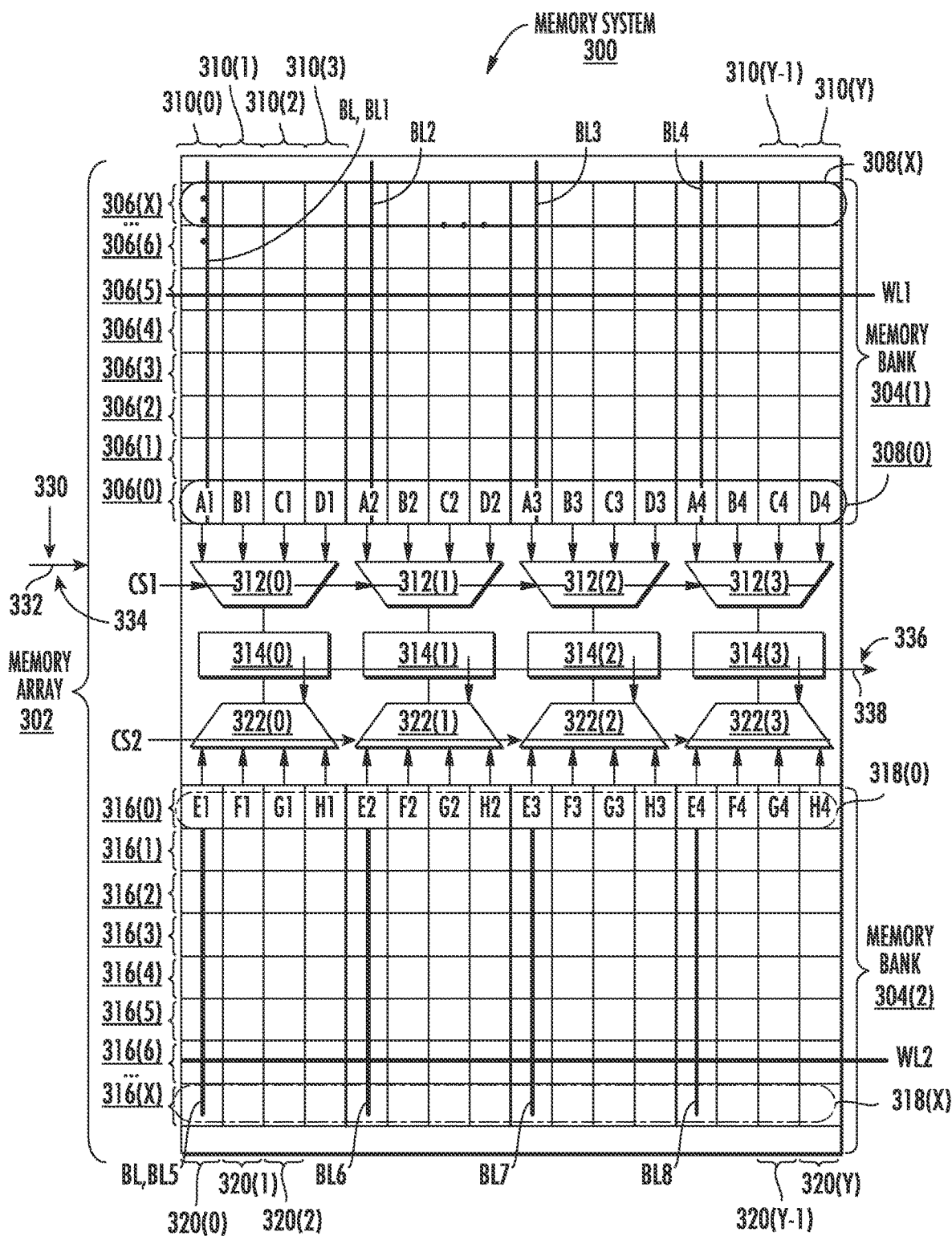
FIG. 3 is an exemplary four (4) column multiplexed (CM4) memory sub-array that can be provided as a memory sub-array in the memory array in FIG. 2.

FIG. 3 is an exemplary memory system 300 that could be provided in a memory in the memory system 208 in the processor-based system 200 in FIG. 2. The memory system 300 includes a memory array 302 that is a four (4) column multiplexed (CM4) memory array. Note that memory array 302 could also be a memory sub-array which is a division of a memory array. In this example, the memory array 302 is not further split into memory sub-arrays. The memory array 302 is split into a first memory bank 304(1) and a second memory bank 304(2), which may store data for respective odd and even memory locations for example. A memory bank is a local unit of memory storage (e.g., memory bit cells) that is controlled by a memory controller for read and write accesses. A memory bank comprises memory bit cell arrays and access circuits (e.g., write driver, sense amplifiers, column multiplexers, charging circuits, and write-assist circuits) used to address the bit cell arrays for read and write operations. If a memory is broken up into several memory banks, typically only one memory bank is accessible at a time to avoid data conflicts since the multiple memory banks typically share some common supporting access circuitry. A memory bank can also be split into multiple memory sub-banks. A memory sub-bank is a subdivision of memory bit cells from a memory bank. Memory sub-banks in a memory bank share common access circuitry with another memory sub-bank in its memory bank—thus only one memory sub-bank may be accessible within a memory bank at a given time In this regard, with reference to FIG. 3, the first memory bank 304(1) includes a plurality of first memory row circuits 306(0))-306(X) that each include a plurality of first memory bit cell circuits 308(0)-308(X). 'X+1' is the number of memory row circuits 306(0)-306(X). Each memory row circuit 306(0))-306(X) includes a respective set of memory bit cell circuits 308(0)-308(X). The sets of memory bit cell circuits 308(0)-308(X) in the respective memory row circuits 306(0)-306(X) in the first memory bank 304(1) are organized in memory column circuits 310(0)-310(Y); thus each set of memory bit cell circuits 308(0))-308(X) includes 'Y+1' memory bit cells. The first memory bank 304(1) has interleaved memory column circuits 310(0)-310(Y) configured to store interleaved data words A, B, C, D according to the interleaved memory column circuits labeled A1, B1, C1, D1, . . . , A4, B4, C4, D4. In this regard, the data word A1-A4 is interleaved across the memory column circuits 310(0)-310(Y) corresponding to the memory column circuits A1, A2, A3, A4. Interleaving the storage of data words in a memory array can reduce bit error rates (BERs).

Similar to the first memory bank 304(1), the second memory bank 304(2) includes a plurality of first memory row circuits 316(0)-316(X) that each include a plurality of second memory bit cell circuits 318(0)-318(X). Each memory row circuit 316(0)-316(X) includes a respective set of memory bit cell circuits 318(0)-318(X). The sets of memory bit cell circuits 318(0)-318(X) in the respective memory row circuits 316(0)-316(X) in the second memory bank 304(2) are organized in memory column circuits 320(0)-320(Y); thus each set of memory bit cell circuits 318(0)-318(X) includes 'Y+1' memory bit cells. The second memory bank 304(2) has interleaved memory column circuits 320(0)-320(Y) configured to store interleaved data words E, F, G, H according to the interleaved memory column circuits labeled E1, F1, G1, H1, . . . , E4, F4, G4, H4. In this regard, the data word E1-E4 is interleaved across the memory column circuits 320(0)-320(Y) corresponding to the memory column circuits E1, E2, E3, E4.

Note that because the first and second memory banks 304(1), 304(2) are coupled to shared memory column access circuits 314(0)-314(3), only one memory bank among the first and second memory banks 304(1), 304(2) is accessed at one time. When the first memory bank 304(1) is accessed (i.e., addressed) in response to a memory operation (read or write operation), a word line WL1 is activated for the selected memory row circuit 306(0)-306(X) according to a decoded memory address 330 on an input bus 332 for the memory access operation. In a memory write operation, write data 334 from the input bus 332 is coupled to the bit lines BL of the selected memory row circuit 306(0)-306(X) to be written into the corresponding memory bit cell circuits 308(0)-308(X) for the selected memory row circuit 306(0)-306(X). In a memory read operation, a column select CS1 is generated to a plurality of column multiplexer circuits 312(0)-312(3) coupled to respective bit lines coupled to each of the memory bit cell circuits 308(0)-308(X) in the respective memory column circuits 310(0)-310(Y) representing an interleaved bit from the selected memory row circuit 306(0)-306(X). Each column multiplexer circuit 312(0)-312(3) couples one of the coupled bit lines BL from its coupled memory column circuits 310(0)-310(Y) to provide the corresponding bit to a respective memory column access circuit 314(0)-314(3) (e.g., sense amplifiers). The memory column access circuit 314(0)-314(3) provides a read data word 336 from the multiplexed bit lines BL in the first memory bank 304(1) on a shared output bus 338. In this manner, the column multiplexer circuits 312(0)-312(3) are controlled to multiplex a selected bit from an interleaved data word in a selected memory row circuit 306(0)-306(X) to a respective memory column access circuit 314(0)-314(3). For example, if it is desired to select interleaved data word A1-A4 from a selected memory row circuit 306(0)-306(X) in a memory read operation, the column multiplexer circuits 312(0)-312(3) are controlled by the column select CS1 to multiplex bits A1-A4 on respective bit lines BL1-BL4 from the selected memory row circuit 306(0)-306(X) to the respective memory column access circuits 314(0)-314(3). Thus, the first memory bank 304(1) is configured in a 4-bit column multiplex (CM4) arrangement in this example.

When the second memory bank 304(2) is accessed (i.e. addressed) in response to a memory operation (read or write operation), a word line WL2 is activated for the selected memory row circuit 316(0)-316(X) according to the decoded memory address 330 on the input bus 332 for the memory access operation. In a memory write operation, the write data 334 from the input bus 332 is coupled to the bit lines BL of the selected memory row circuit 316(0)-316(X) to be written into the corresponding memory bit cell circuits 318(0)-318(X) for the selected memory row circuit 316(0)-316(X). In a memory read operation, column select CS2 is generated to a plurality of column multiplexer circuits 322(0)-322(3) coupled to respective bit lines coupled to each of the memory bit cell circuits 318(0)-318(X) in the respective memory column circuits 320(0)-320(Y) representing an interleaved bit from the selected memory row circuit 316(0)-316(X). Each column multiplexer circuit 322(0)-322(3) couples one of the coupled bit lines from its coupled memory column circuits 320(0)-320(Y) to provide the corresponding bit to a respective memory column access circuit 314(0)-314(3) (e.g., sense amplifiers) that are shared with the first memory bank 304(1). In this manner, the column multiplexer circuits 322(0)-322(3) are controlled to multiplex a selected bit from an interleaved data word in a selected memory row circuit 316(0)-316(X) to a respective memory column access circuit 314(0)-314(3). The memory column access circuit 314(0)-314(3) provides a read data word 336 from the multiplexed bit lines BL of the second memory bank 304(2) on a shared output bus 338. For example, if it is desired to select interleaved data word E1-E4 from a selected memory row circuit 316(0)-316(X) in a memory read operation, the column multiplexer circuits 322(0))-322(3) are controlled by the column select CS1 to multiplex bits E1-E4 on respective bit lines BL5-BL8 from the selected memory row circuit 316(0)-316(X) to the respective memory column access circuits 314(0)-314(3). Thus, the second memory bank 304(2) is also configured in a CM4 arrangement in this example.

Splitting the memory array 302 into the first and second memory banks 304(1), 304(2) reduces the distance between its outer most memory bit cell circuits (e.g., memory bit cell circuits 308(X), 308(X) in each memory bank 304(1), 304(2) and the respective column multiplexer circuits 312(1)-312(4), 322(1)-322(4) and shared memory column access circuit 314(0))-314(3), which can reduce access latency. Each memory bank 304(1), 304(2) also has its own dedicated bit lines BL that are reduced in length more than they otherwise would be if the memory array 302 was not split into the separate first and second memory banks 304(1), 304(2). Reduced length bit lines reduces bit line capacitance, which in turn reduces bit line charging time for reduced memory access latency and power consumption. The first and second memory banks 304(1), 304(2) share the memory column access circuits 314(0))-314(3) to save area and power consumption, but at the expense of only one of the first and second memory banks 304(1), 304(2) being accessible at a given time.

Each memory bank 304(1), 304(2) in the memory array 302 in FIG. 3 can be designed to be accessed at a lower frequency to further reduce power. However, only one of the first and second memory banks 304(1), 304(2) can be accessed at a time to avoid data conflicts on the shared input bus 332 and output bus 338. A memory controller can be configured to control the forwarding of the write data 334 from the input bus 332 to a selected memory bank 304(1), 304(2) in a back and forth "ping-pong" fashion. This can effectively provide twice the access frequency to be equivalent to a non-banked memory sub-array operating at twice the lower frequency. However, the shared input bus 332 to the first and second memory banks 304(1), 304(2) will increase power consumption, because even though write data 334 will only be written to a selected memory bank 304(1), 304(2) that is active, the decoded memory address 330 is received by each first and second memory bank 304(1), 304(2) thereby activating circuitry in both the active and inactive memory banks 304(1), 304(2). Also, write memory glitching can occur when controlling the switching of writing the write data 334 between the first and second memory banks 304(1), 304(2). Adding delay to the timing of write accesses to the first and second memory banks 304(1), 304(2) and the switching to forward the write data 334 from the input bus 332 to the selected first or second memory bank 304(1), 304(2) can avoid write memory glitches, but at the cost of reducing the write bandwidth of the memory array 302.

A memory controller can also be configured to control the forwarding of read data 336 onto the output bus 338 from a selected first or second memory bank 304(1), 304(2) in a back and forth "ping-pong" fashion. Because only one memory bank 304(1), 304(2) can be selected at a time, only read data 336 from the selected memory bank 304(1), 304(2) can be asserted onto the output bus 338 at a given time. Read memory operations can be controlled to only request read data 336 from the first or second memory bank 304(1), 304(2) at a time in a ping-pong fashion. However, read memory glitching can occur when controlling the assertion of the read data 336 from the different first and second memory banks 304(1), 304(2) to the shared memory column access circuits 314(0)-314(3). Adding delay to the timing of read accesses to the first and second memory banks 304(1), 304(2) and the switching to assert the read data 336 from the corresponding first and second memory banks 304(1), 304 (2) shared memory column access circuits 314(0)-314(3) to be asserted on the output bus 338 can avoid read memory glitches, but at the cost reducing the read bandwidth of the memory array 302.

In this regard, to avoid the need to decrease the frequency of memory banks in a memory array while avoiding or reducing read glitches, and while still realizing the reduced power consumption benefits from memory banking, an exemplary memory array 400 is provided in FIG. 4. The memory array 400 in FIG. 4 is split into a first and second memory sub-arrays 402(1), 402(2). Exemplary details of the second memory sub-array 402(2) is shown in FIG. 4 and discussed below, but such details are also applicable to the first memory sub-array 402(1). The second memory sub-array 402(2) is split into a first and second memory banks 404(1), 404(2), that can be like the first and second memory banks 304(1), 304(2) in FIG. 3. In this example, the first, odd memory bank 404(1) is configured to store data for odd memory addresses, and the second, even memory bank 404(2) is configured to store data for even memory addresses. The first and second memory banks 404(1), 404(2) share access to local access circuitry 406 (e.g., write driver circuits, shared memory column access circuits (e.g., sense amplifiers)) to control the assertion of read data 408R(1), 408R(2) read from a selected memory bank 404 (1), 404(2) in a memory read operation onto a read output 410R(1), 410R(2) coupled to the respective memory banks 404(1), 404(2). The local access circuitry 406 also controls the forwarding of write data 408W(1), 408W(2) to be written to a selected memory bank 404(1), 404(2) in a memory write operation onto a respective first and second write output 410W(1), 410W(2) coupled to the respective memory banks 404(1), 404(2).

The memory array 400 includes a global control circuit 412 that is shared between the first and second memory sub-arrays 402(1), 402(2). The global control circuit 412 controls the forwarding of read data 408R(1), 408R(2) from one of the memory banks 404(1), 404(2) onto a shared output bus 414. Because only one memory bank 404(1), 404(2) can be selected at a time, only read data 408R(1), 408R(2) from the selected memory bank 404(1), 404(2) can be asserted onto the output bus 414R at a given time. The global control circuit 412 could be configured to also request read data 408R(1), 408R(2) from each memory bank 404(1), 404(2) in a ping-pong fashion. As discussed in more detail below, to avoid the need to decrease the frequency of the memory banks 404(1), 404(2) while avoiding or reducing read glitches from the switching of read data 408R(1), 408R(2) from a selected memory bank 404(1), 404(2) onto the output bus 414R, the memory array 402 includes a serialization circuit 416S. The serialization circuit 416S is clocked by a read switching clock signal 417 that is either a source clock in the memory array 400 or generated by a serialization clock generation circuit 421 based on the source clock signal 419 in a burst read mode. The read switching clock signal 417 can be thought of as a source clock signal for the serialization circuit 416S. The source clock signal 419 may be used to clock other circuits in the memory array 400 for read and write operations as well as the input and output buses 414W, 414R. The serialization circuit 416S is configured to convert parallel data streams of read data 408R(1), 408R(2) from received from the separately switched first and second memory banks 404(1), 404(2) into a single, serialized, read data stream 408R asserted on the output bus 414R in a burst read mode as controlled by a burst detection circuit 418. The read data 408R(1), 408R(2) is generated on a respective read output 410R(1), 410R(2) as a result of a read driver circuit 415R initiating a read access at a respective memory address in the respective memory bank 404(1), 404(2). The read driver circuit 415R is controlled at a frequency based on the source clock signal 419.

In the example of the memory sub-array 402(2) having the two (2) memory banks 404(1), 404(2), the serialization circuit 416S can provide the serialized read data stream 408R of the read data 408R(1), 408R(2) on the output bus 414R over two (2) back-to-back clock cycles in a high bandwidth, burst read mode. This effectively doubles the output data rate on the output bus 414R, and increasing the read access bandwidth (e.g., bits per second) of the memory sub-array 402(2) and memory array 400. As discussed in more detail below, to assert the serialized read data stream 408R on the output bus 414R in a burst read mode, the serialization circuit 416S is configured to first assert the first read data 408R(1) on the output bus 414R in response to a rising edge of read switching clock signal 417 in a first clock cycle. The serialization circuit 416S is then configured to assert the second read data 408R(2) on the output bus 414R serially following the first read data 408R(1) in response to a rising edge of read switching clock signal 417 in a second clock cycle that immediately follows the first clock cycle. The read switching clock signal 417 may be generated to be twice the frequency of the source clock signal 419 in a burst read mode such that rising edge of the read switching clock signal 417 in the second clock cycle is in response to the falling edge of the first clock cycle of the source clock signal 419 in this example. In this manner, the de-serialization circuit 416S is configured to assert the serialized, read data stream 408R of the first and second read data 408R(1), 408R(2) bubble free in back-to-back clock cycles of the read switching clock signal 417 on the output bus 414R at a much higher bandwidth that the source clock signal 419.

Also as discussed in more detail below, the serialization circuit 416S in the memory array 400 in FIG. 4 can also include circuitry that reduces or avoids read glitches on the output bus 414R during the switching between memory banks 404(1), 404(2). For example, as discussed in more detail below, the serialization clock generation circuit 421 can be configured to generate the read switching clock signal 417 in a manner that its clock pulses are non-overlapping. Since the read switching clock signal 417 controls the switching of whether the de-serialization circuit 416S forward the received first read data 408R(1) or second read data 408R(2) to the output bus 414S, controlling the clock pulses of the read switching clock signal 417 to be non-overlapping by a desired margin can reduce or avoid the read data glitches from the first or second read data 408R(1), 408R(2) being asserted on the output bus 414S in a manner that causes first or second read data 408R(1), 408R(2) to interfere with each other on the output bus 414R before the first or second read data 408R(1), 408R(2) can be latched from the output bus 414R. This allows the memory array 400 to be able to realize the increased output data rate on the output bus 414R.

The serialization circuit 416S can be retained in the burst read mode such that subsequent read data 408R(1), 408R(2) is continued to be asserted as serialized, read data stream 408R on the output bus 414R based on the read switching clock signal 417. As also discussed in more detail below, the serialization circuit 416S can also be configured to operate in a regular, non-burst read mode when detected by the burst detection circuit 418. In a non-burst read mode, read data 408R(1), 408R(2) received from an addressed memory bank 404(1), 404(2) in response to read operations is coupled to the output bus 414R without serializing the read data 408R(1), 408R(2). In this manner, the serialization circuit 416S can be configured to assert the read data 408R(1), 408R(2) when received on the output bus 414R based on the source clock signal 419 for example. For example, in a non-burst read mode, the serialization circuit 416S can be configured to assert the read data 408R(1), 408R(2) when received on the output bus 414R based on rising edges of the source clock signal 419 or rising edges of the read switching clock signal 417 that is reduced in frequency, such as to the frequency of the source clock signal 419, in a non-burst read mode.

With continuing reference to FIG. 4, as also discussed in more detail below; the memory array 400 in this example also can include a de-serialization circuit 416D. The de-serialization circuit 416D is configured to convert a received, serialized write data stream 408W from a common input bus 414W for a write operation, into separate, parallel first and second write data 408W(1), 408W(2) to be written simultaneously to the memory banks 404(1), 404(2) in a burst write mode. The serialized write data stream 408W to be written is asserted by write request from a write driver circuit 415W to write the data in the serialized write data stream 408W starting at a specified memory address contained in a memory bank 404(1), 404(2). The write driver circuit 415W is controlled at a frequency based on the source clock signal 419. The de-serialization circuit 416D can be configured to de-multiplex the first and second write data 408W(1), 408W(2) from the serialized write data stream 408W. The de-serialization circuit 416D then assert the separate write data 408W(1), 408W(2) within the write data stream 408W into respective memory banks 404(1), 404(2) at half the frequency of the input bus 414W, thus allowing more time to switch between the memory banks 404(1), 404(2) to write the separate write data 408W(1), 408W(2) to the respective memory banks 404(1), 404(2) to reduce or avoid write data glitching.

In the example of the memory sub-array 402(2) including the two (2) memory banks 404(1), 404(2), the de-serialization circuit 416D can be configured to store the received write data 408W over consecutive first and second clock cycles of the source clock signal 419 in a burst write mode. Alternatively, the de-serialization circuit 416D can be configured to store the received write data 408W over consecutive first and second clock cycles of a write clock signal 417W in a burst write mode generated by a de-serialization clock generation circuit 423. For example, the de-serialization clock generation circuit 423 may be configured to generate the write clock signal 417W at the same frequency of the source clock signal 419. As an example, the separate write lines to activate the write operation for each memory bank 404(1), 404(2) can be setup by the second clock cycle of the source clock signal 419 or write clock signal 417W to then allow the separate write data 408W(1), 408W(2) to be asserted simultaneously to each memory bank 404(1), 404 (2) to be written therein. For example, the de-serialization circuit 416S can be configured to assert the first write data 408W(1) on the first write output 410 to be written to the first memory bank 404(1) in response a second clock cycle of the source clock signal 419 or write clock signal 417W immediately following the first clock cycle of the source clock signal 419 or write clock signal 417W. The de-serialization circuit 416S can also assert the second write data 408W(1) on the second write output 410 to be written to the second memory bank 404(1) also in response to the second clock cycle of the source clock signal 419 or write clock signal 417W to be written in parallel with the first write data 408W(1) to the respective memory banks 404(1), 404(2). In this manner, because the de-serialization circuit 416D allows the parallelized write data 408W(1), 408W(2) to be written to the memory banks 404(1), 404(2) simultaneously, the overall write bandwidth of the memory sub-array 402(2) and memory array 400 is not reduced from the frequency of the input bus 414W. In this manner, the write bandwidth of the memory sub-array 402(2) and memory array 400 does not have to be reduced from the frequency of the input bus 414W to write the write data 408W(1), 408W(2) between switched memory banks 404(1), 404(2).

The de-serialization circuit 416S can also be retained in the burst write mode such that subsequent write data 408W (1), 408W(2) from subsequently received serialized write data streams 408W is continued to be converted into parallel first and second write data 408W(1), 408W(2) to be written in parallel to the first and second memory banks 404(1), 404(2) based on the source clock signal 419. As also discussed in more detail below, de-serialization circuit 416D can also be configured to operate in a regular, non-burst write mode as detected by the burst detection circuit 418. In a non-burst write mode, write data 408W is written to only one addressed memory bank 404(1), 404(2) at a time. For example, as discussed in more detail below, de-serialization circuit 416S can be configured in a non-burst write mode to write received write data in the write data stream 408W as it is received, to one memory bank 404(1), 404(2) at a time.

Note that the memory banks 404(1), 404(2) in the memory array 400 in FIG. 4 can each be further split into memory sub-banks. For example, memory bank 404(1) can be split into two (2) memory sub-banks 420(1)(1), 420(1) (2). Memory bank 404(2) can be split into two (2) memory sub-banks 420(2)(1), 420(2)(2). A memory sub-bank is a subdivision of memory bit cells from a memory bank. Memory sub-banks in a memory bank share common access circuitry with another memory sub-bank in its memory bank—thus only one memory sub-bank may be accessible within a memory bank at a given time. The serialization and de-serialization circuits 416S, 416D discussed above can be configured to serialize read data and parallelize write data to the different memory sub-banks 420(1)(1), 420(1)(2), 420(2)(1), 420(2)(2) of the respective memory banks 404(1), 404(2).

FIG. 5 is a flowchart illustrating an exemplary serialization process 500 of a serialization circuit 416S converting parallel data streams of first and second read data 408R(1), 408R(2) received from separately switched memory banks 404(1), 404(4) in the memory array 400 in FIG. 4 into a single, serialized, read data stream 408R to be provided on the output bus 414R in a burst read mode.

In this regard, as shown in FIG. 5, the serialization process 500 includes receiving a source clock signal 419 (block 502 in FIG. 5). The receiving a source clock signal 419 could also include the generation of the read switching clock signal 417R. The serialization process 500 also includes the read driver circuit 415R accessing first read data 408R(1) stored at a first memory address in a first memory bank 404(1) in a first memory array 400 (block 504 in FIG. 5). The serialization process 500 also includes the first memory bank 404(1) asserting the first read data 408R(1) on the first read output 410R(1) of the first memory bank 404(1) (block 506 in FIG. 5). The serialization process 500 also includes the read driver circuit 415R accessing second read data 408R(2) stored at a second memory address in the second memory bank 404(2) in the first memory array 400 (block 508 in FIG. 5). The serialization process 500 also includes the second memory bank 404(2) asserting the second read data 408R(2) on a second read output 410R(2) of the second memory bank 404(2) (block 510 in FIG. 5). The serialization process 500 also includes the serialization circuit 416S asserting the first read data 408R(1) on a first output bus 414R in response to a first clock cycle of a source clock signal 419 (or read switching clock cycle 417R (block 512 in FIG. 5). The serialization process 500 also includes the serialization circuit 416S asserting the second read data 408R(2) on the first output bus 414R after the asserting of the first read data 408R(1) on the first output bus 414R, in response the first clock cycle (e.g., second clock cycle of the source clock signal 419, or first clock cycle of the read switching clock cycle 417R (block 514 in FIG. 5).

As discussed above with regard to the memory array 400 in FIG. 4, a de-serialization circuit 416D can also be provided in the memory array 400 to convert a received, serialized write data stream 408W received on the input bus 414W for a write operation into separate, parallel first and second write data streams 408W(1), 408W(2) to be written simultaneously to the respective memory banks 404(1), 404(2) in a burst write mode. In this regard, FIG. 6 is a flowchart illustrating an exemplary de-serialization process 600 of the de-serialization circuit 416D in the memory array 40 in FIG. 4 convert a received, serialized write data stream 408W received on the input bus 414W for a write operation into separate, parallel first and second write data streams 408W(1), 408W(2) to be written simultaneously to the respective memory banks 404(1), 404(2) in a burst write mode.

In this regard, as shown in FIG. 6, the de-serialization process 600 includes receiving a source clock signal 419 (block 602 in FIG. 6). The receiving a source clock signal 419 could also include the generation of the read switching clock signal 417R. The de-serialization process 600 also includes the write driver circuit 415W in FIG. 4 asserting a first write data stream 408W on a first input bus 414W to be written starting at a first memory address in the memory array 400 (block 604 in FIG. 6). The de-serialization process 600 also includes the de-serialization circuit 416D receiving the first write data stream 408W from the first input bus 414W in response to a first clock cycle of a source clock signal 419 (block 606 in FIG. 6). The de-serialization process 600 also includes the de-serialization circuit 416D de-multiplexing first write data 408W(1) and second write data 408W(2) from the first write data stream 408W (block 608 in FIG. 6). The de-serialization process 600 also includes asserting the first write data 408W(1) of the first write data stream 408W on a first write output 410W(1) coupled to a first memory bank 404(1) in a memory array 400 to be written to the first memory address in the first memory bank 404(1) in response to a second clock cycle of the source clock signal 419 immediately following the first clock cycle of the source clock signal 419 (block 610 in FIG. 6). The de-serialization process 600 also includes asserting the second write data 408W(2) of the first write data stream 408W on a second write output 410W(2) coupled to a second memory bank 404(2) in a memory array 400 to be written to a second memory address based on the first memory address in the second memory bank 404(2) in response to the second clock cycle of the source clock signal 419 (block 612 in FIG. 6).

The serialization circuit 416S and de-serialization circuit 416D can be used together or by themselves in the memory array 400 in FIG. 4. The serialization circuit 416S and de-serialization circuit 416D can also be realized through different circuit implementations.

In this regard, FIG. 7 is a circuit diagram of an exemplary serialization circuit 716S that can be provided as the serialization circuit 416S in the memory array 400 in FIG. 4 for example. The serialization circuit 716S in FIG. 7 is discussed in reference to the memory array 400 in FIG. 4 in this example. The serialization circuit 716D is configured to be able to serialize read data 408R(1), 408R(2) from each of the four (4) memory sub-banks 404(1)(1), 404(1)(2), 404(2)(1), 404(2)(2). As shown in FIG. 7, the serialization circuit 716S includes four (4) multiplexer circuits 700(1)(1), 700(1)(2), 700(2)(1), 700(2)(2). Multiplexer circuits 700(1)(1), 700(1)(2) are for serializing first read data 408R(1) from the respective memory sub-banks 420(1)(1), 420(1)(2) of the first memory bank 404(1). Multiplexer circuits 700(2)(1), 700(2)(2) are for serializing second read data 408R(2) from the respective memory sub-banks 420(2)(1), 420(2)(2) of the second memory bank 404(2).

With continuing reference to FIG. 7, the multiplexer circuits 700(1)(1), 700(1)(2) each include respective clock inputs 702(1)(1), 702(1)(2) that are configured to receive the read switching clock signal 417R in FIG. 4. The multiplexer circuits 700(2)(1), 700(2)(2) also each include respective clock inputs 702(2)(1), 702(2)(2) that are configured to receive the read switching clock signal 417R in FIG. 4. The multiplexer circuits 700(1)(1), 700(1)(2) are each configured to be coupled to bit line BL and a complement bit line BLB from the respective memory sub-banks 420(1)(1), 420(1)(2) to receive first read data 408R(1). The multiplexer circuits 700(2)(1). 700(2)(2) are each configured to be coupled to bit line BL and a complement bit line BLB from the respective memory sub-banks 420(2)(1), 420(2)(2) to receive second read data 408R(2). In response to a first clock cycle of the read switching clock signal 417R, the multiplexer circuits 700(1)(1), 700(1)(2) are configured to pass the first read data 408R(1) from their respective memory sub-bank 420(1)(1), 420(1)(2) of the first memory bank 404(2) when accessed to an output 704. In response to a second clock cycle immediately following the read switching clock signal 417R, the multiplexer circuits 700(2)(1), 700(2)(2) are configured to pass the second read data 408R(2) from their respective memory sub-bank 420(2)(1), 420(2)(2) of the second memory bank 404(2) when accessed to the output 704. FIG. 8 is a signal diagram that illustrates a read switching clock signal 417R generated by the serialization clock generation circuit 421 in FIG. 4. As shown in FIG. 8, in this example, the read switching clock signal 417R is based on twice the frequency of the source clock signal 419. The read switching clock signal 417R is generated by the serialization clock generation circuit 421 to have non-overlapping pulses in this example so that the multiplexer circuits 700(1)(1), 700(1)(2) and multiplexer circuits 700(2)(1), 700(2)(2) do not switch at the same time or close in time to cause glitches on the output 704. In this manner, this reduces or avoids the glitching of first and second read data 408R(1), 408R(2) on the output 704.

In this manner, the multiplexer circuits 700(1)(1), 700(1)(2), 700(2)(1), 700(2)(2) can be controlled to multiplex the separately received first and second read data 408R(1), 408R(2) from the first and second memory banks 404(1), 404(2) into a serialized read data stream 408R on the output 704. Only one (1) multiplexer circuit among the multiplexer circuits 700(1)(1), 700(1)(2) for the memory sub-banks 420(1)(1), 420(1)(2) will be active at a time to have valid first read data 408R(1) from the first memory bank 404(1). The multiplexer circuits 700(1)(1), 700(1)(2), 700(2)(1). 700(2)(2) multiplex the read data 408R(1), 408R(2) onto the output 704 based on the read switching clock signal 417R in this example. Only one (1) multiplexer circuit among the multiplexer circuits 700(2)(1), 700(2)(2) for the memory sub-banks 420(2)(1), 420(2)(2) will be active at a time to have valid second read data 408R(2) from the second memory bank 404(2). As shown in FIG. 7, the multiplexer circuits 700(1)(1), 700(1)(2) for the first memory bank 404(1) are configured to be responsive to the rising edge 800(1) of a first clock cycle 802(1) of the read switching clock signal 417R. The multiplexer circuits 700(2)(1), 700(2)(2) for the second memory bank 404(4) are configured to be responsive to the rising edge 800(2) of a second clock cycle 802(2) of the read switching clock signal 417R that immediately follows the first clock cycle 802(1). Thus, as discussed above, this causes the multiplexer circuits 700(1)(1), 700(1)(2), 700(2)(1), 700(2)(2) to be able to multiplex the first and second read data 408R(1), 408R(2), respectively, on the output 704 based on the frequency of the read switching clock signal 417R.

Alternatively, the multiplexer circuits 700(1)(1), 700(1)(2) for the first memory bank 404(1) can be configured to be responsive to the rising edge 804(1) of a first clock cycle 806(1) of the source clock signal 419. The multiplexer circuits 700(2)(1), 700(2)(2) for the second memory bank 404(4) can be configured to be responsive to the falling edge 804(2) of the first clock cycle 806(1) of the source clock signal 419. In this example, the frequency of the source clock signal 419 is half the frequency of the read switching clock signal 417R. Switching of the multiplexer circuits 700(1)(1), 700(1)(2) based on the read switching clock signal 417R can be thought of as being based on the source clock signal 419. Thus, as discussed above, this causes the multiplexer circuits 700(1)(1), 700(1)(2), 700(2)(1), 700(2)(2) to be able to multiplex the first and second read data 408R(1), 408R(2), respectively, on the output 704 based on the frequency of the read switching clock signal 417R.

With continuing reference to FIG. 7, the output 704 is coupled to a read latch circuit 706 to latch either the first or second read data 408R(1), 408R(2). In this example, the read latch circuit 706 is cross-coupled inverter circuits 708(1), 708(2) that retain the data on the output 704 until the data on the output 704 is changed. Additional buffer circuits 712(1), 712(2) (e.g., two serially coupled inverter circuits) can be coupled to an output 704 of the read latch circuit 706 to add delay and/or to provide voltage domain shifting to provide the multiplexed read data 408R(1), 408R(2) as the serialized read data stream 408R on the output bus 414R shown in FIG. 4.

Note that the description of the multiplexer circuits 700(1)(1), 700(1)(2). 700(2)(1), 700(2)(2) of the serialization circuit 716S in FIG. 7 above are in regard to the memory array 400 being in a burst read mode. The burst read mode can be detected by a burst detection circuit, such as burst detection circuit 418 in FIG. 4 as an example, and communicated to the serialization circuit 716S. As previously discussed, the multiplexer circuits 700(1)(1), 700(1)(2), 700(2)(1), 700(2)(2) of the serialization circuit 716S in FIG. 7 can also be configured in a non-burst read mode. In a non-burst read mode, read data 408R(1), 408R(2) received from an addressed memory bank 404(1), 404(2) in response to read operations is coupled to the output bus 414R without the first and second read data 408R(1), 408R(2) necessarily being serialized in back-to-back clock cycles of the read switching clock signal 417D, or even the source clock signal 419. In a non-burst read mode, the serialization circuit 416S can be configured to assert the read data 408R(1), 408R(2) when received on the output bus 414R based on the source clock signal 419 for example. For example, in a non-burst read mode, the serialization circuit 416S can be configured to assert the read data 408R(1), 408R(2) when received on the output 704 based on rising edges of the source clock signal 419 or rising edges of the read switching clock signal 417 that is reduced in frequency, such as to the frequency of the source clock signal 419, in a non-burst read mode.

FIG. 9 is a circuit diagram of an exemplary de-serialization circuit 916D provided in a memory array 900. The memory array 900 could be in the memory array 400 in FIG. 4. The de-serialization circuit 916D will be described in reference to FIG. 4 and FIG. 9. The de-serialization circuit 916D is configured to de-multiplex received serialized write data stream 408W for a write operation into separate, parallel first and second write data 408W(1), 408W(2) to be written simultaneously to the separate memory banks 404(1), 404(2) in a burst write mode.

As shown in FIG. 9, the first memory bank 404(1) includes 'X+1' memory row circuits 906(0)-906(X) that each include a plurality of memory row bit cells 908(0)(0)-908(X)(Y) organized in respective memory column circuits 910(0)-910(Y). In this example, the memory row bit cells 908(0)(0)-908(X)(Y) are SRAM bit cells that support a bit line BL and complementary bit line BLB. The second memory bank 404(2) includes 'X+1' memory row circuits 916(0)-916(X) that each include a plurality of memory row bit cells 918(0)(0)-918(X)(Y) organized in respective memory column circuits 920(0)-920(Y). In this example, the memory row bit cells 918(0)(0)-918(X)(Y) are SRAM bit cells that support a bit line BL and complementary bit line BLB. The memory banks 404(1), 404(2) are further split into the separate memory sub-banks 420(1)(1)-420(1)(2), 420(2)(1)-420(2)(2) as discussed in FIG. 4 above. In this example, the memory row bit cells 908(0)(0)-908(X)(Y), 918(0)(0)-918(X)(Y) in respective separate memory sub-banks 420(1)(1)-420(1)(2), 420(2)(1)-420(2)(2) share separate bit lines BL and complement bit lines BLB along the memory sub-bank boundary. The outer memory sub-banks 420(1)(2), 420(2)(2) can employ separate "floating" bit lines BL, BLB, which will be described in another example in FIG. 11 that could be employed in the memory array 900 in FIG. 9. The bit lines BL and complement bit lines BLB for the first memory bank 404(1) are coupled to a first column multiplexer circuit 930(1). The bit lines BL and complement bit lines BLB for the second memory bank 404(2) are coupled to a second column multiplexer circuit 930(2). Write driver circuits 415W(1), 415W(2) are provided for each memory bank 404(1), 404(2) to write respective write data 408W(1), 408W(2) to each memory bank 404(1), 404(2) in the memory row circuit 906(0)-906(X), 916(0)-916(X) at the designated respective memory address for the write operation. The write data 408W(1), 408W(2) to be written to the memory array 900 is received in the write data stream 408W.

With continuing reference to FIG. 9, to de-serialize the write data stream 408W into the respective separate, parallel first and second write data 408W(1), 408W(2) that can be written simultaneously to the separate memory banks 404 (1), 404(2) as discussed above with regard to FIG. 4 in a burst write mode, the de-serialization circuit 916D is provided. The de-serialization circuit 416D in FIG. 4 can be the de-serialization circuit 916D in FIG. 9. In this example, the de-serialization circuit 416D includes a first and second write latch circuits 932(1), 932(2). The first and second write latch circuits 932(1), 932(2) may be flip-flops for example. The first and second write latch circuits 932(1), 932(2) are clocked by the respective write clock signals 417W(1), 417W(2) that are generated by a de-serialization clock generation circuit 423 based on the source clock signal 419 as shown in signal diagram in FIG. 10. Both the first and second write latch circuits 932(1), 932(2) are coupled to the input bus 414W that carries the write data stream 408W. As an example, assuming the write data stream 408W consists of data D0, D1 as shown in the Din signal in FIG. 10, the first write latch circuit 932(1) is configured to latch first write data 408W(1) D0 in response to a first clock cycle 434(1) of the write clock signal 417W(1), and as also shown in FIG. 10. The second write latch circuit 932(2) is configured to latch the second write data 408W(2) D1 in response to a second clock cycle 434(2) of the write clock signal 417W (2), and as also shown in FIG. 10. The second clock cycle 434(2) of the write clock signal 417W(2) immediately follows the first clock cycle 434(1) of the write clock signal 417W(1). In this manner, the first and second write latch circuits 932(1), 932(2) are configured to store the respective first and second write data 408W(1), 408W(2) in a serial fashion as it arrives in the write data stream 408W on the input bus 414W.

The de-serialization circuit 916D, and more specifically its first and second latch circuits 932(1), 932(2), are configured to assert the de-multiplexed and latched first and second write data 408W(1), 408W(2) to respective multiplexer circuits 936(1), 936(2). The first and second clock cycles 434(1), 434(2) of the write clock signals 417W(1), 417W(2) can be controlled to equalize the clock to q (data) minimum and maximum setup and latch times to avoid glitching of the first and second write data 408W(1), 408W (2) to respective multiplexer circuits 936(1), 936(2). The de-serialization circuit 916D has the ability to assert the first write data 408W(1) to either the first memory bank 404(1) or the second memory bank 404(2) to be written therein, and also has the ability to assert the second write data 408W(2) to either the first memory bank 404(1) or the second memory bank 404(2) to be written therein. For example, if the memory bank 404(1) is configured to store data for odd memory addresses, and the memory bank 404(2) is configured to store data for even memory addresses, the multiplexer circuits 936(1), 936(2) can be controlled to direct first write data 404W(1) to either the first memory bank 404(1) if data is to be written to an odd memory address or the second memory bank 404(2) if data is to be written to an even memory address in this example. Similarly, the multiplexer circuits 936(1), 936(2) can be controlled to direct second write data 404W(2) to either the first memory bank 404(1) if data is to be written to an odd memory address or the second memory bank 404(2) if data is to be written to an even memory address in this example.

Note that the multiplexer circuits 936(1), 936(2) in FIG. 9 are optional. The multiplexer circuits 936(1), 936(2) are provided in this example so that the de-serialization circuit 916D has the ability to assert the first write data 408W(1) to either the first memory bank 404(1) or the second memory bank 404(2) to be written therein. And as also discussed above, the multiplexer circuits 936(1), 936(2) allow for ability to assert the second write data 408W(2) to either the first memory bank 404(1) or the second memory bank 404(2) to be written therein. But note that the de-serialization circuit 916D does not require the inclusion of the multiplexer circuits 936(1), 936(2). The de-serialization circuit 916D could be configured to write the first write data 408W(1) to the first memory bank 404(1) and the second write data 408W(2) to the second memory bank 404(2), or vice versa.

As shown in the signal diagram in FIG. 10, in this example, the first and second write latch circuits 932(1), 932(2) of the de-serialization circuit 916D are configured to assert the first and second write data 408W(1), 408W(2) clock cycles to multiplexer circuits 936(1), 936(2) to be written to both memory banks 404(1), 404(2) at the same time. This is accomplished by the write line WL for both memory banks 404(1), 404(2) being activated in response to the second clock cycle 434(2) of the write clock signal 417W(2). The write lines are shown as WL1 and WL2 for each memory bank 404(1), 404(2), but note that only one write line for each memory bank 404(1), 404(2) can be active at one time to select a respective memory row circuit 906(0)-906(X), 916(0))-916(X) for the first and second write data 408W(1), 408W(2) to be written to. In this manner, both data D0 for the first write data 408W(1) and the data D1 for the second write data 408W(2) are stored in their respective first and second write latch circuits 932(1), 932(2). Thereafter, both latched data D0 for the first write data 408W(1) and latched data D1 for the second write data 408W(2) can be written at the same time to their respective memory banks 404(1), 404(2) in the burst write mode. The burst read mode can be detected by a burst detection circuit, such as burst detection circuit 418 in FIG. 4 as an example, and communicated to the de-serialization circuit 916S. The burst detection circuit can be configured the burst write mode based on the burst enable signal BURST_EN shown in FIG. 10. In this example, the first and second write clock signals 432(1), 432(2) are double the frequency of the source clock signal 419. The de-serialization circuit 916D can continue to write de-multiplexed write data 408W(1), 408(2) from subsequently received write data streams 408W in back-to-back clock cycles (e.g., D2, D3, D4, D5, etc. as shown in FIG. 10).

Note that the de-serialization circuit in FIG. 9 can also be configured to be in a non-burst write mode. As shown in FIG. 10, in a non-burst write mode 440, only the first write latch circuit 932(1) is clocked by the first write clock signal 432(1) at half the frequency of the source clock signal 419 to serially write the write data 408W(1), 408W(2) from the write data stream 408W to an addressed memory bank 404(1), 404(2).

FIG. 11 is an exemplary memory system 1100 that has a memory array 1102 that includes a memory bank 1103 in an exemplary CM4 interleave arrangement that is similar to a memory bank 304(1), 304(2) in the memory system 300 in FIG. 3. The serialization and/or deserialization circuits and processes described above in FIGS. 4-10 can be provided and/or performed in the memory array 1102 in FIG. 11. As discussed below, the memory system 1100 includes a memory bank 1103 that has increased memory density over the memory banks 304(1), 304(2) in FIG. 3 for example at a reduced power consumption per memory unit. In this regard, the memory array 1102 in FIG. 11 includes a first, inner memory sub-bank 1104(1), and a first outer memory sub-bank 1104(2). A memory bank can also be split into multiple memory sub-banks. A memory sub-bank is a subdivision of memory bit cells from a memory bank. Memory sub-banks in a memory bank share common access circuitry with another memory sub-bank in its memory bank—thus only one memory sub-bank may be accessible within a memory bank at a given time.

The memory sub-bank 1104(1) is coupled to column multiplexer circuits 1112(0)-1112(3) to multiplex data bits from the first memory sub-bank 1104(1) to respective memory column access circuits 1114(0)-1114(3). The memory column access circuits 1114(0)-1114(3) are sense amplifier circuits in this example that can sense the memory state on signals on respective bit lines BL(1)(0)-BL(1)(Y) multiplexed to it from the respective column multiplexer circuits 1112(0)-1112(3). However, the memory array 1102 in FIG. 11 also includes a second memory sub-bank 1104(2) that is also coupled to the column multiplexer circuits 1112(0)-1112(3) to multiplex data bits from bit lines BL(2)(0)-BL(2)(Y) from the second memory sub-bank 1104(3) to respective memory column access circuits 1114(0)-1114(3). The memory column access circuits 1114(0)-1114(3) can also sense the memory state on signals on respective bit lines BL(2)(0)-BL(2)(Y) multiplexed to it from the respective column multiplexer circuits 1112(0)-1112(3). In this manner, the memory density of the memory array 1102 with its two (2) memory sub-banks 1104(1), 1104(2) that share the common column multiplexer circuits 1112(0)-1112(3) and memory column access circuits 1114(0)-1114(3) is increased. However, it is desired that adding the second memory sub-bank 1104(2) does not increase the length of the bit lines of the first memory sub-bank 1104(1).

In this regard, as shown in FIG. 11, the first, inner memory sub-bank 1104(1) is located closer to the column multiplexer circuits 1112(0)-1112(3) and memory column access circuits 1114(0)-1114(3) than the second, outer memory sub-bank 1104(2). The inner memory sub-bank 1104(1) has X+1 number of memory row circuits 1106(0)-1106(X) that each include a plurality of memory bit cell circuits 1108(0)(0)-1108(X)(Y). For example, memory row circuit 1106(0) includes Y+1 memory bit cell circuits 1108(0)(0)-1108(0)(Y). Memory row circuit 1106(X) includes Y memory bit cell circuits 1108(X)(0)-1108(X)(Y). As a non-limiting example, the memory bit cell circuits 1108(0)(0)-1108(X)(Y) may be static random access memory (SRAM) bit cells, that employ a six (6) transistor (6-T) or greater transistor count. The memory bit cell circuits 1108(0)(0)-1108(X)(Y) could also be dynamic random access memory (DRAM) bit cells as another example. The organization of the memory bit cell circuits 1108(0)(0)-1108(X)(Y) is such that one memory bit cell circuit 1108( )(0)-1108( )(Y) from each memory row circuit 1106(0)-1106(X) is arranged in the same respective memory column circuit 1110(0)-1110(Y). Only memory column circuits 1110(0), 1110(Y) are labeled in FIG. 3. For example, there may be 256 memory column circuits 1110(0)-1110(255) provided in the inner memory sub-bank 1104(1).

With continuing reference to FIG. 11, the inner memory sub-bank 1104(1) includes Y number of first bit lines BL(1)(0)-BL(1)(Y) each coupled to the memory bit cell circuits 1108(0)(0)-1108(X)(Y) in a respective memory row circuit 1106(0)-1106(X). The first bit lines BL(1)(0)-BL(1)(Y) can be pre-charged to write data into memory bit cell circuits 1108(0)(0)-1108(X)(Y) in a selected memory row circuit 1106(0)-1106(Y) controlled by an activation of a word line WL by a memory driver circuit 1118 for the selected memory row circuit 1106(0)-1106(X) according to a decoded memory address 1116. Only one WL is shown in FIG. 11, but note that there is a separate WL provided for each memory row circuit 1106(0)-1106(X) that is coupled to each memory bit cell circuit 1108(0)(0)-1108(X)(Y) in its respective memory row circuit 1106(0)-1106(X). Only one of the WLs for a given memory row circuit 1106(0)-1106(X) is activated to select the memory row circuit 1106(0)-1106(X) for a memory access operation. The memory bit cell circuits 1108(0)(0)-1108(X)(Y) in a selected memory row circuit 1106(0)-1106(X) can also assert data onto a respective bit line BL(1)(0)-BL(1)(Y) for a memory read operation to be provided to the column multiplexer circuits 1112(0)-1112(3) and memory column access circuits 1114(0)-1114(3).

As discussed above, to increase the memory density of the memory array 1102, the second, outer memory sub-bank 1104(2) is also included in the memory system 1100. The outer memory sub-bank 1104(2) is located farther away from the column multiplexer circuits 1112(0)-1112(3) and memory column access circuits 1114(0)-1114(3) than the inner memory sub-bank 1104(1). Like the inner memory sub-bank 1104(1), the outer memory sub-bank 1104(2) has X+1 number of memory row circuits 1126(0)-1126(X) that each include a plurality of memory bit cell circuits 1128(0)(0)-1128(X)(Y). For example, memory row circuit 1126(0) includes Y+1 memory bit cell circuits 1128(0)(0)-1128(0)(Y). Memory row circuit 1126(X) includes Y memory bit cell circuits 1128(X)(0)-1128(X)(Y). As a non-limiting example, the memory bit cell circuits 1128(0)(0)-1128(X)(Y) may be SRAM bit cells, that employ a six (6) transistor (6-T) or greater transistor count. The memory bit cell circuits 1128(0)(0)-1128(X)(Y) could also be DRAM bit cells as another example. The organization of the memory bit cell circuits 1128(0)(0)-1128(X)(Y) is such that one memory bit cell circuit 1128( )(0)-1128(Y) from each memory row circuit 1126(0)-1126(X) is arranged in the same respective memory column circuit 1130(0)-1130(Y). Only memory column circuits 1130(0), 1130(Y) are labeled in FIG. 11. For example, there may be 256 memory column circuits 1130(0)-1130(255) provided in the outer memory sub-bank 1104(2).

With continuing reference to FIG. 11, the outer memory sub-bank 1104(2) also includes Y number of second bit lines BL(2)(0)-BL(2)(Y) each coupled to the memory bit cell circuits 1128(0)(0)-1128(X)(Y) in a respective memory row circuit 1126(0)-1126(X). The second bit lines BL(2)(0)-BL(2)(Y) can be pre-charged to write data into memory bit cell circuits 1128(0)(0)-1128(X)(Y) in a selected memory row circuit 1126(0)-1126(Y) controlled by an activation of a word line WL by the memory driver circuit 1118 for the selected memory row circuit 1126(0)-1126(X) according to the decoded memory address 1116. Note that there is a separate WL provided for each memory row circuit 1126(0)-1126(X) that is coupled to each memory bit cell circuit 1128(0)(0)-1128(X)(Y) in its respective memory row circuit 1126(0)-1126(X). Only one of the WLs for a given memory row circuit 1126(0)-1126(X) in outer memory sub-bank 1104(2) and memory row circuit 1106(0)-1106(X) in inner memory sub-bank 1104(1) is activated to select either a memory row circuit 1126(0)-1126(X) or a memory row circuit 1106(0)-1106(X) for a memory access operation. The memory bit cell circuits 1128(0)(0)-1128(X)(Y) in a selected memory row circuit 1126(0)-1126(X) can also assert data onto a respective bit line BL(2)(0)-BL(2)(Y) for a memory read operation to be provided to the column multiplexer circuits 1112(0)-1112(3) and memory column access circuits 1114(0)-1114(3).

The first and second memory sub-banks 1104(1), 1104(2) are designed to store interleaved data words A, B, C, D according to the interleaved memory column circuits labeled A1, B1, C1, D1, . . . , A4, B4, C4, D4. Thus, the memory array 1102 is also configured in a CM4 interleave arrangement. Thus, there are four (4) column multiplexer circuits 1112(0)-1112(3) in this example to support the CM4 interleave arrangement. There can be a number of column multiplexer circuits 1112(0)-1112(3) equal to or greater than two (2) to match the interleaving scheme.

When the inner or outer memory sub-banks 1104(1), 1104(2) are accessed in response to a memory read operation, a word line WL is activated for the selected memory row circuit 1106(0)-1106(X), 1126(0)-1126(X) according to the decoded memory address 1116 for the memory access operation. The column select CS1 is generated to the column multiplexer circuits 1112(0)-1112(3) coupled to respective first and second bit lines BL(1)(0)-BL(1)(Y), BL(2)(0)-BL(2)(Y) coupled to the respective memory bit cell circuits 1108(0)(0)-1108(0)(Y), 1128(0)(0)-1128(0)(Y) in the respective memory column circuits 1110(0)-1110(Y), 1130(0)-1130(Y) representing an interleaved bit from the selected memory row circuit 1106(0)-1106(X), 1126(0)-1126(X). Each column multiplexer circuit 1112(0)-1112(3) couples one of the coupled first and second bit lines BL(1)(0)-BL(1)(Y), BL(2)(0)-BL(2)(Y) from its coupled memory column circuits 1110(0)-1110(Y), 1130(0)-1130(Y) to a respective multiplex output 1120(0)-1120(3) to provide the corresponding bit to a respective memory column access circuit 1114(0)-1114(3) (e.g., sense amplifiers). In this manner, the column multiplexer circuits 1112(0)-1112(3) are controlled to multiplex a selected bit from an interleaved data word in a selected memory row circuit 1106(0)-1106(X), 1126(0)-1126(X) according to a respective memory column access circuit 1114(0)-1114(3). The memory column access circuits 1114(0)-1114(3) are configured to provide bits of a data output word 1124 on respective column outputs 1122(0)-1122(3) for a memory read operation.

For example, if it is desired to select interleaved data word A1-A4 from a selected memory row circuit 1106(0)-1106(X) in a memory read operation, the column multiplexer circuits 1112(0)-1112(3) are controlled by the column select CS1 to multiplex bits A1-A4 on respective first bit lines BL(1)(0), BL(1)(3), BL(1)(7), BL(1)(11) from the selected memory row circuit 1106(0)-1108(X) on the respective multiplex outputs 1120(0)-1102(3) to the respective memory column access circuits 1114(0)-1114(3). The memory column access circuits 1114(0)-1114(3) are configured to provide signals indicative of the read bits on the first bit lines BL(1)(0), BL(1)(3), BL(1)(7), BL(1)(11) onto respective column outputs 1122(0)-1122(3) as the data output word 1124.

As shown in FIG. 11 and discussed above, the first and second bit lines BL(1)(0)-BL(1)(Y), BL(2)(0)-BL(2)(Y), are provided for each memory column circuit 1110(0)-1110(Y), 1130(0)-1130(Y) of the respective memory sub-banks 1104(1), 1104(2). The first bit lines BL(1)(0)-BL(1)(Y) could be extended in length to provide bit lines for each memory column circuit 1130(0)-1130(Y) of the outer memory sub-bank 1104(2). For example, the first bit lines BL(1)(0)-BL(1)(Y) for the inner memory sub-bank 1104(1) may extend in a first metal layer (e.g., M0 or M2) in or above the memory bit cell circuits 1108(0)(0)-1108(X)(Y). Extending the length of first bit lines BL(1)(0)-BL(1)(Y) would increase the capacitance of the first bit lines BL(1)(0)-BL(1)(Y) thus reducing memory performance to the memory array 1102 in an undesired manner.

Thus, to avoid the need to have lengthen the first bit lines BL(1)(0)-BL(1)(Y) in the inner memory sub-bank 1104(1) to provide bit lines for the outer memory sub-bank 1104(2), the second bit lines BL(2)(0)-BL(2)(Y) for the outer memory sub-bank 1104(2) in the memory system 1100 in FIG. 11 are provided as separate bit lines. The second bit lines BL(2)(0)-BL(2)(Y) for the outer memory sub-bank 1104(2) are distinct bit lines and are coupled to the respective column multiplexer circuits 1112(0)-1112(3) apart from the first bit lines BL(1)(0)-BL(1)(Y) for the inner memory sub-bank 1104(1). However, a path must be provided between the second bit lines BL(2)(0)-BL(2)(Y) for the outer memory sub-bank 1104(2) to the column multiplexer circuits 1112(0)-1112(3). The memory bit cell circuits 1108(0)(0)-1108(X)(Y) could be changed in design to accommodate a coupling of the second bit lines BL(2)(0))-BL(2)(Y) in additional metal line routing paths in the first metal layer that accommodates the first bit lines BL(1)(0)-BL(1)(Y) for the inner memory sub-bank 1104(1) and extending through the inner memory sub-bank 1104(2) to the column multiplexer circuits 1112(0)-1112(3) alongside the BL(1)(0))-BL(1)(Y). However, fabrication limitation may prevent or otherwise make it undesirable to change the cell design of all the memory bit cell circuits 1108(0)(0)-1108(X)(Y) to accommodate the coupling of first bit lines BL(1)(0))-BL(1)(Y) to the first metal layer to provide for additional metal line routing path for second bit lines BL(2)(0)-BL(2)(Y) alongside the first bit lines BL(1)(0))-BL(1)(Y).

In this regard as shown in FIG. 11, to avoid the need to both lengthen the first bit lines BL(1)(0))-BL(1)(Y) in the inner memory sub-bank 1104(1) to extend to the outer memory sub-bank 1104(2), jumper cell circuits 1132(0)-1132(Y) are provided. In this example, the outer most memory bit cell circuits 1108(X)(0)-1108(X)(Y) that are adjacent to the outer memory sub-bank 1104(2) are provided as the jumper cell circuits 1132(0)-1132(Y). The jumper cell circuits 1132(0)-1132(Y) are each coupled to the second bit lines BL(2)(0)-BL(2)(Y) for the outer memory sub-bank 1104(2) as well as the first bit lines BL(1)(0))-BL(1)(Y) for the inner memory sub-bank 1104(1). The jumper cell circuits 1132(0)-1132(Y) each include respective metal interconnects 1134(0)-1134(Y) that couple respective second bit lines BL(2)(0)-BL(2)(Y) for the outer memory sub-bank 1104(2) to respective flying bit lines FBL(0)-FBL(Y). In this example, the metal interconnects 1134(0)-1134(Y) of the respective jumper cell circuits 1132(0)-1132(2) couple respective to the second bit lines BL(2)(0))-BL(2)(Y) in the first metal layer for the outer memory sub-bank 1104(2) to respective flying bit lines FBL(0)-FBL(Y) in a second metal layer ML2 (e.g., M4). For example, the second metal layer ML2 may be disposed in a higher metal layer than the first metal layer ML1 in which the first bit lines BL(1)(0)-BL(1)

(Y) for the inner memory sub-bank 1104(1) are disposed. In this manner, the flying bit lines FBL(0)-FBL(Y) can "fly over" the first metal layer ML1 in which the first bit lines BL(1)(0))-BL(1)(Y) for the inner memory sub-bank 1104(1) are disposed in a vertical direction to be coupled to the respective column multiplexer circuits 1112(1)-1112(3).

FIG. 12 is a block diagram of an exemplary processor-based system 1200 that includes a processor 1202 configured to execute computer instructions for execution. The processor-based system also includes a memory system 1204 that includes one or more memory arrays that each include multiple memory banks and include an integrated serialization circuit configured to convert parallel data streams of read data received from separately switched memory banks into a single, serialized, read data stream to be provided on the output bus in a burst read mode, and/or a de-serialization circuit configured to convert a received, serialized write data stream on an input bus for a write operation into separate, parallel write data streams to be written simultaneously to the memory banks in a burst write mode. The memory system 1204 in this example includes an instruction cache 1206, a data cache 1208, and a system memory 1210. Any memories in the memory system 1204 in FIG. 12 could include the memory arrays 400, 900, 1102 in FIGS. 4, 9 and 11, as non-limiting examples.

With continuing reference to FIG. 12, the processor-based system 1200 may be a circuit or circuits included in an electronic board card, such as, a printed circuit board (PCB), a server, a personal computer, a desktop computer, a laptop computer, a personal digital assistant (PDA), a computing pad, a mobile device, or any other device, and may represent, for example, a server or a user's computer. The processor 1202 represents one or more general-purpose processing circuits, such as a microprocessor, central processing unit, or the like. The processor 1202 includes an instruction processing circuit 1209 configured to execute processing logic in computer instructions for performing the operations and steps discussed herein. The processor 1202 also includes the instruction cache 1206 for temporary, fast access memory storage of instructions. Fetched or prefetched instructions from a memory, such as from a system memory 1210 over a system bus 1212, are stored in the instruction cache 1206. The processor 1202 also includes a data cache 1208 for temporary, fast access memory storage of data from the system memory 1210 over the system bus 1212.

The processor 1202 and the system memory 1210 are coupled to the system bus 1212 and can intercouple peripheral devices included in the processor-based system 1200. As is well known, the processor 1202 communicates with these other devices by exchanging address, control, and data information over the system bus 1212. For example, the processor 1202 can communicate bus transaction requests to a memory controller 1214 in the system memory 1210 as an example of a slave device. Although not illustrated in FIG. 12, multiple system buses 1212 could be provided, wherein each system bus constitutes a different fabric. In this example, the memory controller 1214 is configured to provide memory access requests to a memory array 1216 in the system memory 1210. The memory array 1216 is comprised of an array of storage bit cells for storing data. The system memory 1210 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 1212. As illustrated in FIG. 12, these devices can include the system memory 1210, one or more input device(s) 1218, one or more output device(s) 1220, a modem 1222, and one or more display controllers 1224, as examples. The input device(s) 1218 can include any type of input device, including but not limited to input keys, switches, voice processors, etc. The output device(s) 1220 can include any type of output device, including but not limited to audio, video, other visual indicators, etc. The modem 1222 can be any device configured to allow exchange of data to and from a network 1226. The network 1226 can be any type of network, including but not limited to a wired or wireless network, a private or public network, a local area network (LAN), a wireless local area network (WLAN), a wide area network (WAN), a BLUETOOTH™ network, and the Internet. The modem 1222 can be configured to support any type of communications protocol desired. The processor 1202 may also be configured to access the display controller(s) 1224 over the system bus 1212 to control information sent to one or more displays 1228. The display(s) 1228 can include any type of display, including but not limited to a cathode ray tube (CRT), a liquid crystal display (LCD), a plasma display, etc.

The processor-based system 1200 in FIG. 12 may include a set of instructions 1230 that when executed by a processor, such as processor 1202, perform serialization of read data from the memory system 1204 by converting parallel data streams of read data received from separately switched memory banks into a single, serialized, read data stream to be provided on the output bus in a burst read mode, and/or perform de-serialization of write data communicated to the memory system 1204 to be written by converting a received, serialized write data stream on an input bus for a write operation into separate, parallel write data streams to be written simultaneously to the memory banks in a burst write mode. The instructions 1230 may be stored in the system memory 1210, processor 1202, and/or instruction cache 1206 as examples of non-transitory computer-readable medium 1232. The instructions 1230 may also reside, completely or at least partially, within the system memory 1210 and/or within the processor 1202 during their execution. The instructions 1230 may further be transmitted or received over the network 1226 via the modem 1222, such that the network 1226 includes the non-transitory computer-readable medium 1232, or the input device 1218 as other examples.

While the non-transitory computer-readable medium 1232 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory (RAM), a magnetic disk storage medium, an optical storage medium, flash memory devices, etc.) and the like.

Unless specifically stated otherwise and as apparent from the previous discussion, it is appreciated that throughout the description, discussions utilizing terms such as "processing." "computing." "determining." "displaying," or the like, refer to the action and processes of a computer system, or similar electronic computing device, that manipulates and transforms data and memories represented as physical (electronic) quantities within the computer system's registers into other data similarly represented as physical quantities within the computer system memories, registers, or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium, and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A memory array, comprising:
a first output bus;
a first memory bank comprising a first read output;
a second memory bank comprising a second read output;
a first read driver circuit clocked by a source clock signal, the first read driver circuit configured to:

access a first read data stored at a first memory address in the first memory bank to be asserted on the first read output; and access second read data stored at a second memory address in the second memory bank to be asserted on the second read output;

a serialization clock generation circuit configured to:
receive the source clock signal of a first frequency; and
generate a read switching clock signal at a second frequency higher than the first frequency in a burst read mode; and a serialization circuit comprising a serialization clock input configured to receive the read switching clock signal, the serialization circuit configured to:
assert the first read data on the first output bus in response to a first clock cycle of the read switching clock signal; and
assert the second read data on the first output bus after the assertion of the first read data on the first output bus, in response to the second clock cycle of the read switching clock signal immediately following the first clock cycle of the read switching clock signal.

2. The memory array of claim 1, wherein:
the first read driver circuit is further configured to:
access third read data stored at a third memory address in the first memory bank to be asserted on the first read output; and
access fourth read data stored at a fourth memory address in the second memory bank to be asserted on the second read output; and
the serialization circuit is further configured to:
assert the third read data on the first output bus in response to a third clock cycle of the read switching clock signal immediately following the second clock cycle of the read switching clock signal; and
assert the fourth read data on the first output bus after the assertion of the third read data on the first output bus, in response to a fourth clock cycle of the read switching clock signal immediately following the third clock cycle of the read switching clock signal.

3. The memory array of claim 1, wherein:
the first read driver circuit is further configured to:
access third read data stored at a third memory address in the first memory bank to be asserted on the first read output; and
access fourth read data stored at a second memory address in the second memory bank to be asserted on the second read output; and
the serialization circuit is further configured to:
assert the third read data on the first output bus in response to a third clock cycle of the source clock signal; and
assert the fourth read data on the first output bus after the assertion of the third read data on the first output bus, in response a fourth clock cycle of the source clock signal.

4. The memory array of claim 1, wherein the serialization clock generation circuit is further configured to generate the read switching clock signal comprising non-overlapping clock pulses.

5. The memory array of claim 1, wherein the second frequency of the read switching clock signal is twice the first frequency of the source clock signal.

6. The memory array of claim 1, wherein the serialization clock generation circuit is further configured to generate the read switching clock signal at the first frequency of the clock signal in a non-burst read mode.

7. The memory array of claim 1, wherein the serialization circuit further comprises a read latch circuit coupled to the first output bus,
the read latch circuit configured to:
latch the first read data in response to a third clock cycle of the source clock signal prior to the first clock cycle of the source clock signal; and
latch the second read data in response to the first clock cycle of the source clock signal.

8. The memory array of claim 1, further comprising:
a first memory sub-array comprising the first memory bank and the second memory bank;
a second memory sub-array, comprising:
a third memory bank comprising a third read output; and
a fourth memory bank comprising a fourth read output; and
a second read driver circuit, clocked by the source clock, the second read driver circuit configured to:
access third read data stored at a third memory address in the third memory bank to be asserted on the third read output; and
access fourth read data stored at a fourth memory address in the fourth memory bank to be asserted on the fourth read output; and
a second serialization circuit configured to:
assert the third read data on a second output bus in response to a third clock cycle of the source clock signal; and
assert the fourth read data on the second output bus in response to a fourth clock cycle of the source clock signal immediately following the third clock cycle of the source clock signal.

9. The memory array of claim 1, wherein:
the first memory bank further comprises a plurality of first memory row circuits each comprising a plurality of first memory bit cell circuits each located in a respective first memory column circuit of a plurality of first memory column circuits; and
the second memory bank further comprises a plurality of second memory row circuits each comprising a plurality of second memory bit cell circuits each located in a respective second memory column circuit of a plurality of second memory column circuits.

10. A method of serializing read data from a plurality of memory banks in a memory array, comprising:
receiving a source clock signal;
accessing a first read data stored at a first memory address in a first memory bank in a first memory array based on the source clock signal;
asserting the first read data on a first read output of the first memory bank;
accessing second read data stored at a second memory address in a second memory bank in the first memory array;
asserting the second read data on a second read output of the second memory bank;
receiving the source clock signal of a first frequency;
generating a read switching clock signal at a second frequency higher than the first frequency in a burst read mode;
asserting the first read data on a first output bus in response to a first clock cycle of the read switching clock signal; and
asserting the second read data on the first output bus after the asserting of the first read data on the first output bus, in response a second clock cycle of the read switching clock signal immediately following the first clock cycle of the source clock signal.

* * * * *